(12) United States Patent
Lotfi et al.

(10) Patent No.: US 8,253,196 B2
(45) Date of Patent: *Aug. 28, 2012

(54) INTEGRATED CIRCUIT WITH A LATERALLY DIFFUSED METAL OXIDE SEMICONDUCTOR DEVICE AND METHOD OF FORMING THE SAME

(75) Inventors: Ashraf W. Lotfi, Bridgewater, NJ (US); William W. Troutman, Montville, NJ (US); Douglas Dean Lopata, Boyertown, PA (US); Tanya Nigam, Sunnyvale, CA (US)

(73) Assignee: Enpirion, Inc., Hampton, NJ (US)

( * ) Notice: Subject to any disclaimer, the term of this patent is extended or adjusted under 35 U.S.C. 154(b) by 301 days.

This patent is subject to a terminal disclaimer.

(21) Appl. No.: 12/550,027

(22) Filed: Aug. 28, 2009

(65) Prior Publication Data

US 2010/0052052 A1    Mar. 4, 2010

Related U.S. Application Data

(60) Continuation-in-part of application No. 11/805,233, filed on May 22, 2007, now Pat. No. 7,759,184, which is a division of application No. 10/767,684, filed on Jan. 29, 2004, now Pat. No. 7,230,302.

(51) Int. Cl.
*H01L 21/00* (2006.01)
(52) U.S. Cl. ............ 257/334; 257/336; 257/337
(58) Field of Classification Search ............ 257/334, 257/336–337
See application file for complete search history.

(56) References Cited

U.S. PATENT DOCUMENTS

| | | |
|---|---|---|
| 4,761,725 A | 8/1988 | Henze |
| 4,918,026 A | 4/1990 | Kosiak et al. |
| 4,922,327 A | 5/1990 | Mena et al. |
| 4,947,192 A | 8/1990 | Hawkins et al. |
| 4,982,353 A | 1/1991 | Jacob et al. |
| 5,014,098 A | 5/1991 | Schlais et al. |
| 5,029,283 A | 7/1991 | Ellsworth et al. |
| 5,047,358 A | 9/1991 | Kosiak et al. |
| 5,156,989 A | 10/1992 | Williams et al. |
| 5,169,794 A | 12/1992 | Iranmanesh |
| 5,264,782 A | 11/1993 | Newton |
| 5,285,369 A | 2/1994 | Balakrishnan |
| 5,321,319 A | 6/1994 | Mahmood |
| 5,366,916 A | 11/1994 | Summe et al. |
| 5,469,334 A | 11/1995 | Balakrishnan |

(Continued)

OTHER PUBLICATIONS

Betancourt-Zamora, R.J. et al., "A 1.5 mW, 200 MHz CMOS VCO for Wireless Biotelemetry," First International Workshop on Design of Mixed-Mode Integrated Circuits and Applications, Jul. 1997, pp. 72-74, Cancun, Mexico.

(Continued)

*Primary Examiner* — Laura Menz
(74) *Attorney, Agent, or Firm* — Slater & Matsil L.L.P.

(57) ABSTRACT

An integrated circuit with a transistor advantageously embodied in a laterally diffused metal oxide semiconductor device having a gate located over a channel region recessed into a semiconductor substrate and a method of forming the same. In one embodiment, the transistor includes a source/drain including a lightly or heavily doped region adjacent the channel region, and an oppositely doped well extending under the channel region and a portion of the lightly or heavily doped region of the source/drain. The transistor also includes a channel extension, within the oppositely doped well, under the channel region and extending under a portion of the lightly or heavily doped region of the source/drain.

20 Claims, 20 Drawing Sheets

U.S. PATENT DOCUMENTS

| | | | |
|---|---|---|---|
| 5,485,027 A | 1/1996 | Williams et al. | |
| 5,504,450 A | 4/1996 | McPartland | |
| 5,594,324 A | 1/1997 | Canter et al. | |
| 5,610,421 A | 3/1997 | Contiero et al. | |
| 5,644,266 A | 7/1997 | Chen et al. | |
| 5,689,213 A | 11/1997 | Sher | |
| 5,710,054 A | 1/1998 | Gardner et al. | |
| 5,859,606 A | 1/1999 | Schrader et al. | |
| 5,877,611 A | 3/1999 | Brkovic | |
| 5,888,861 A | 3/1999 | Chien et al. | |
| 5,889,315 A | 3/1999 | Farrenkopf et al. | |
| 5,982,645 A | 11/1999 | Levran et al. | |
| 6,005,377 A | 12/1999 | Chen et al. | |
| 6,118,351 A | 9/2000 | Kossives et al. | |
| 6,204,542 B1 | 3/2001 | Kinoshita et al. | |
| 6,255,714 B1 | 7/2001 | Kossives et al. | |
| 6,262,564 B1 | 7/2001 | Kanamori | |
| 6,271,063 B1 | 8/2001 | Chan et al. | |
| 6,285,539 B1 | 9/2001 | Kashimoto et al. | |
| 6,288,424 B1 | 9/2001 | Ludikhuize | |
| 6,297,108 B1 | 10/2001 | Chu | |
| 6,320,449 B1 | 11/2001 | Capici et al. | |
| 6,333,217 B1 * | 12/2001 | Umimoto et al. | 438/197 |
| 6,380,004 B2 | 4/2002 | Boden, Jr. et al. | |
| 6,384,447 B2 | 5/2002 | Mihnea et al. | |
| 6,384,643 B1 | 5/2002 | Grose et al. | |
| 6,388,468 B1 | 5/2002 | Li | |
| 6,392,275 B1 | 5/2002 | Jang | |
| 6,407,579 B1 | 6/2002 | Goswick | |
| 6,413,806 B1 | 7/2002 | Sicard et al. | |
| 6,420,771 B2 | 7/2002 | Gregory | |
| 6,477,065 B2 | 11/2002 | Parks | |
| 6,495,019 B1 | 12/2002 | Filas et al. | |
| 6,521,960 B2 | 2/2003 | Lee | |
| 6,541,819 B2 * | 4/2003 | Lotfi et al. | 257/335 |
| 6,545,360 B1 | 4/2003 | Ohkubo et al. | |
| 6,551,871 B2 | 4/2003 | Takamura | |
| 6,573,694 B2 | 6/2003 | Pulkin et al. | |
| 6,650,169 B2 | 11/2003 | Faye et al. | |
| 6,653,174 B1 | 11/2003 | Cho et al. | |
| 6,730,962 B2 | 5/2004 | Wu | |
| 6,744,676 B2 | 6/2004 | Leung et al. | |
| 6,765,272 B2 | 7/2004 | Natsume | |
| 6,791,305 B2 | 9/2004 | Imai et al. | |
| 6,822,882 B1 | 11/2004 | Jacobs et al. | |
| 6,833,585 B2 | 12/2004 | Kim et al. | |
| 6,855,985 B2 | 2/2005 | Williams et al. | |
| 6,873,017 B2 | 3/2005 | Cai et al. | |
| 6,879,137 B2 | 4/2005 | Sase et al. | |
| 6,900,101 B2 | 5/2005 | Lin | |
| 6,911,694 B2 | 6/2005 | Negoro et al. | |
| 6,998,674 B2 * | 2/2006 | Osada et al. | 257/316 |
| 7,012,792 B2 | 3/2006 | Yoshida | |
| 7,015,544 B2 * | 3/2006 | Lotfi et al. | 257/336 |
| 7,019,505 B2 | 3/2006 | Dwarakanath et al. | |
| 7,038,438 B2 | 5/2006 | Dwarakanath et al. | |
| 7,071,044 B1 * | 7/2006 | Krishnan et al. | 438/197 |
| 7,186,606 B2 * | 3/2007 | Lotfi et al. | 438/200 |
| 7,190,026 B2 * | 3/2007 | Lotfi et al. | 257/336 |
| 7,195,981 B2 * | 3/2007 | Lotfi et al. | 438/289 |
| 7,214,985 B2 * | 5/2007 | Lotfi et al. | 257/336 |
| 7,229,886 B2 * | 6/2007 | Lotfi et al. | 438/305 |
| 7,230,302 B2 * | 6/2007 | Lotfi et al. | 257/369 |
| 7,232,733 B2 * | 6/2007 | Lotfi et al. | 438/332 |
| 7,244,994 B2 * | 7/2007 | Lotfi et al. | 257/369 |
| 7,262,476 B2 * | 8/2007 | Bude et al. | 257/493 |
| 7,330,017 B2 | 2/2008 | Dwarakanath et al. | |
| 7,335,948 B2 * | 2/2008 | Lotfi et al. | 257/338 |
| 7,365,402 B2 * | 4/2008 | Ma | 257/408 |
| 7,391,080 B2 * | 6/2008 | Arnborg et al. | 257/335 |
| 7,489,007 B2 * | 2/2009 | Williams et al. | 257/335 |
| 7,544,995 B2 * | 6/2009 | Lotfi et al. | 257/335 |
| 7,576,391 B2 * | 8/2009 | Williams et al. | 257/335 |
| 7,605,428 B2 * | 10/2009 | Williams et al. | 257/335 |
| 7,626,233 B2 * | 12/2009 | Tornblad et al. | 257/343 |
| 7,683,426 B2 * | 3/2010 | Williams et al. | 257/335 |
| 7,683,453 B2 * | 3/2010 | Williams et al. | 257/490 |
| 7,719,054 B2 * | 5/2010 | Williams et al. | 257/335 |
| 7,737,526 B2 * | 6/2010 | Williams et al. | 257/506 |
| 7,759,184 B2 * | 7/2010 | Lotfi et al. | 438/199 |
| 7,812,393 B2 * | 10/2010 | Williams et al. | 257/335 |
| 7,876,080 B2 * | 1/2011 | Dwarakanath et al. | 323/284 |
| 7,952,459 B2 * | 5/2011 | Lotfi et al. | 336/200 |
| 2004/0094806 A1 | 5/2004 | Schillaci et al. | |
| 2004/0227190 A1 | 11/2004 | Cai et al. | |
| 2005/0110080 A1 * | 5/2005 | Arnborg et al. | 257/335 |
| 2005/0112822 A1 * | 5/2005 | Litwin | 438/270 |
| 2005/0167756 A1 * | 8/2005 | Lotfi et al. | 257/369 |
| 2005/0168203 A1 | 8/2005 | Dwarakanath et al. | |
| 2005/0168205 A1 | 8/2005 | Dwarakanath et al. | |
| 2005/0169024 A1 | 8/2005 | Dwarakanath et al. | |
| 2005/0179084 A1 | 8/2005 | Robb et al. | |
| 2006/0027864 A1 | 2/2006 | Negoro et al. | |
| 2006/0038225 A1 * | 2/2006 | Lotfi et al. | 257/335 |
| 2006/0038237 A1 | 2/2006 | Lotfi et al. | |
| 2006/0038238 A1 * | 2/2006 | Lotfi et al. | 257/369 |
| 2006/0039224 A1 | 2/2006 | Lotfi et al. | |
| 2006/0040441 A1 | 2/2006 | Lotfi et al. | |
| 2006/0040449 A1 | 2/2006 | Lotfi et al. | |
| 2006/0040451 A1 * | 2/2006 | Lotfi et al. | 438/305 |
| 2006/0040452 A1 * | 2/2006 | Lotfi et al. | 438/305 |
| 2006/0081937 A1 * | 4/2006 | Lotfi et al. | 257/369 |
| 2006/0145250 A1 * | 7/2006 | Ma | 257/336 |
| 2007/0224752 A1 * | 9/2007 | Lotfi et al. | 438/199 |
| 2007/0284658 A1 * | 12/2007 | Lotfi et al. | 257/338 |
| 2008/0061368 A1 * | 3/2008 | Williams et al. | 257/336 |
| 2008/0061400 A1 * | 3/2008 | Williams et al. | 257/546 |
| 2008/0067585 A1 * | 3/2008 | Williams et al. | 257/330 |
| 2008/0067586 A1 * | 3/2008 | Williams et al. | 257/335 |
| 2008/0067588 A1 * | 3/2008 | Williams et al. | 257/343 |
| 2008/0142899 A1 * | 6/2008 | Morris et al. | 257/371 |
| 2008/0153221 A1 * | 6/2008 | Sridhar et al. | 438/230 |
| 2008/0199999 A1 * | 8/2008 | Weijtmans et al. | 438/285 |
| 2008/0242032 A1 * | 10/2008 | Chakravarthi et al. | 438/285 |
| 2009/0167267 A1 * | 7/2009 | Dwarakanath et al. | 323/282 |
| 2009/0261791 A1 * | 10/2009 | Lopata et al. | 323/282 |
| 2009/0269899 A1 * | 10/2009 | Osada et al. | 438/299 |
| 2010/0038727 A1 * | 2/2010 | Chakravarthi et al. | 257/408 |
| 2010/0044789 A1 * | 2/2010 | Lotfi et al. | 257/336 |
| 2010/0052049 A1 * | 3/2010 | Lotfi et al. | 257/334 |
| 2010/0052050 A1 * | 3/2010 | Lotfi et al. | 257/334 |
| 2010/0052051 A1 * | 3/2010 | Lotfi et al. | 257/334 |
| 2010/0052052 A1 * | 3/2010 | Lotfi et al. | 257/336 |
| 2010/0141228 A1 * | 6/2010 | Lopata et al. | 323/282 |
| 2010/0156374 A1 * | 6/2010 | Lopata et al. | 323/282 |
| 2010/0164449 A1 * | 7/2010 | Dwarakanath et al. | 323/282 |
| 2010/0164650 A1 * | 7/2010 | Abou-Alfotouh et al. | 333/181 |
| 2010/0244106 A1 * | 9/2010 | Parker et al. | 257/288 |
| 2010/0244152 A1 * | 9/2010 | Bahl et al. | 257/408 |
| 2010/0267212 A1 * | 10/2010 | Morris | 438/275 |
| 2011/0049621 A1 * | 3/2011 | Lotfi et al. | 257/337 |
| 2011/0074498 A1 * | 3/2011 | Thompson et al. | 327/543 |
| 2011/0095742 A1 * | 4/2011 | Lopata et al. | 323/283 |
| 2011/0101933 A1 * | 5/2011 | Lopata et al. | 323/271 |
| 2011/0101934 A1 * | 5/2011 | Lopata et al. | 323/271 |
| 2011/0101948 A1 * | 5/2011 | Lopata et al. | 323/283 |
| 2011/0101949 A1 * | 5/2011 | Lopata et al. | 323/286 |
| 2011/0215414 A1 * | 9/2011 | Osada et al. | 257/369 |
| 2011/0221000 A1 * | 9/2011 | Shima | 257/344 |

OTHER PUBLICATIONS

Goodman, J. et al., "An Energy/Security Scalable Encryption Processor Using an Embedded Variable Voltage DC/DC Converter," IEEE Journal of Solid-State Circuits, Nov. 1998, vol. 33, No. 11, IEEE, Los Alamitos, CA.

Horowitz, P., et al., "The Art of Electronics," Second Edition, 1989, pp. 288-291, Cambridge University Press, Cambridge, MA.

Lotfi, A.W., et al., "Issues and Advances in High-Frequency Magnetics for Switching Power Supplies," Proceedings of the IEEE, Jun. 2001, vol. 89, No. 6, pp. 833-845, IEEE, Los Alamitos, CA.

Ludikhuize, A.W., "A Review of RESURF Technology," Proceedings of IEEE ISPSD 2000, May 22, 2000, pp. 11-18.

* cited by examiner

INTEGRATED CIRCUIT WITH A LATERALLY DIFFUSED METAL OXIDE SEMICONDUCTOR DEVICE AND METHOD OF FORMING THE SAME

This application is a continuation in part of, and claims priority to, U.S. patent application Ser. No. 11/805,233, entitled "Laterally Diffused Metal Oxide Semiconductor Device and Method of Forming the Same," filed on May 22, 2007, now, U.S. Pat. No. 7,759,184, issued Jul. 20, 2010, which is a divisional of U.S. patent application Ser. No. 10/767,684, entitled "Laterally Diffused Metal Oxide Semiconductor Device and Method of Forming the Same," filed on Jan. 29, 2004, now, U.S. Pat. No. 7,230,302, issued Jun. 12, 2007, all of which are incorporated herein by reference.

TECHNICAL FIELD

The present invention is directed, in general, to integrated circuits and, more specifically, to an integrated circuit with a laterally diffused metal oxide semiconductor device and method of forming the same.

BACKGROUND

The design of early integrated circuits focused on implementing an increasing number of small semiconductor devices on a semiconductor substrate to achieve substantial improvements in manufacturing efficiency and cost, product size, and performance. The continuing improvements in the design of integrated circuits over the past few decades has been so dramatic and so pervasive in numerous products that the effects can be measured in changes in industries.

The design and construction of integrated circuits has continued to evolve in a number of different areas. One area of innovation is a continuing reduction of feature sizes of semiconductor devices such as control and signal processing devices formed on a semiconductor substrate. Another area of innovation is the advent of construction techniques to incorporate higher voltage semiconductor devices (also referred to as "higher voltage devices") having higher voltage handling capability such as switches of a power train of a power converter into the integrated circuits.

An objective of incorporating control and signal processing devices on a semiconductor substrate with the higher voltage devices often encounters conflicting design requirements. More specifically, lower voltages (e.g., 2.5 volts ("V")) are employed with the control and signal processing devices (hence, also referred to as "low voltage devices") to prevent breakdown between the fine line structures thereof. A potential difference of only a few volts separated by a fraction of a micrometer ("μm") can produce electric fields of sufficient magnitude to induce locally destructive ionization in the control and signal processing devices.

When employing the higher voltage devices on the same integrated circuit therewith, it is often necessary to sense and switch higher external circuit voltages (e.g., at least ten volts) on the integrated circuit. To accommodate the higher voltage devices on a semiconductor substrate with the control and signal processing devices, a large number of processing steps are performed to produce the integrated circuit. Since the cost of an integrated circuit is roughly proportional to the number of processing steps to construct the same, there has been limited progress in the introduction of low cost integrated circuits that include both control and signal processing devices and higher voltage devices such as the switches of the power train of a power converter.

The aforementioned constraints have been exacerbated by the need to employ a substantial area of the semiconductor substrate to incorporate more efficient and even higher voltage devices into an integrated circuit. Inasmuch as the cost of a die that incorporates the integrated circuit is roughly proportional to the area thereof, the presence of the higher voltage devices conflicts with the reduction in area achieved by incorporating the fine line features in the control and signal processing devices.

With respect to the type of semiconductor devices readily available, complementary metal oxide semiconductor ("CMOS") devices are commonly used in integrated circuits. The CMOS devices such as P-type metal oxide semiconductor ("PMOS") devices and N-type metal oxide semiconductor ("NMOS") devices are used as logic devices, memory devices, or other devices such as the control and signal processing devices. In addition to the CMOS devices, laterally diffused metal oxide semiconductor ("LDMOS") devices such as P-type laterally diffused metal oxide semiconductor ("P-LDMOS") devices and N-type laterally diffused metal oxide semiconductor ("N-LDMOS") devices are also commonly used in integrated circuits. LDMOS devices are generally used for the higher voltage devices in the integrated circuit. In the context of CMOS technology, the higher voltage devices generally relate to devices that operate at voltages above a standard operating voltage for the selected CMOS devices (e.g., the low voltage devices). For instance, CMOS devices employing fine line structures having 0.25 micrometer line widths operate at or below about 2.5 volts. Thus, higher voltage devices generally include any devices operating above approximately 2.5 volts.

Integrating the CMOS and LDMOS devices on a semiconductor substrate has been a continuing goal in the field of microelectronics and has been the subject of many references over the years. For instance, U.S. Pat. No. 6,541,819 entitled "Semiconductor Device Having Non-Power Enhanced and Power Enhanced Metal Oxide Semiconductor Devices and a Method of Manufacture Therefor," to Lotfi, et al., issued Apr. 1, 2003, which is incorporated herein by reference, incorporates non-power enhanced metal oxide semiconductor devices (i.e., low voltage devices) with power enhanced metal oxide semiconductor devices (i.e., higher voltage devices) on a semiconductor substrate. While Lotfi, et al. provides a viable alternative to integrating low voltage devices and higher voltage devices on the semiconductor substrate, further improvements are preferable in view of the higher voltage handling capability associated with the use of higher voltage devices such as with the LDMOS devices in the power train of a power converter.

In the field of power microelectronics, the CMOS devices may be employed as the control and signal processing devices integral to the controller of a power converter. As an example, the control and signal processing devices are employed as low voltage switches and comparators that form portions of the controller of the power converter. The LDMOS devices, on the other hand, may be employed as the higher voltage devices integral to the power train of the power converter. The higher voltage devices perform the power switching functions to control the flow of power to, for instance, a microprocessor. The power switches include the main power switches, synchronous rectifiers, and other power switches germane to the power train of the power converter. The power switches can also be used for circuit protection functions such as a rapidly acting electronic version of an ordinary fuse or circuit breaker. Variations of power switches include metal oxide semiconductor field effect transistors ("MOSFETs") that exhibit low level gate-to-source voltage limits (e.g. 2.5 volts) and otherwise are capable of handling the higher voltages germane to the power train of the power converter.

To achieve the overall reduction in size, the integrated circuits as described herein should include control and signal processing devices with fine line structures having sub-micron line widths (e.g., 0.25 micrometers) on a semiconductor substrate that operate with lower voltages to prevent breakdown within the integrated circuit. At the same time, the integrated circuit may incorporate higher voltage devices that can conduct amperes of current and withstand voltages of, for instance, at least ten volts. A benefit of incorporating the low voltage devices and the higher voltage devices on the semiconductor substrate is that it is possible to accommodate higher switching frequencies in the design of the power processing circuit due to a reduction of parasitic capacitances and inductances in the integrated circuit.

While a design and implementation of low voltage devices such as logic devices that form portions of a microprocessor have been readily incorporated into integrated circuits, the systems that power the logic devices have not to date been readily incorporated into integrated circuits. There has been pressure directed to the power electronics industry to make parallel improvements in the power conversion technology and, in particular, with the power converters that regulate the power to, for instance, the microprocessors that employ a high level of integrated circuit technology in the design thereof. Thus, an evolutionary direction in the power electronics industry is to reduce the size and cost of the power converters, which correspondingly induces greater levels of silicon integration in a design of the integrated circuits embodying the same.

Although power converters have shown dramatic improvements in size, cost, and efficiency over the past few decades, the design of the power converters have not kept pace with the improvements in integrated circuit technology directed to the logic devices and the like, which follow Moore's Law demonstrating a doubling of device (e.g., transistor) density about every 18 months. As representative examples of improvements in the smaller and more compact power converters, see U.S. Pat. No. 5,469,334, entitled "Plastic Quad-packaged Switched-mode Integrated Circuit with Integrated Transformer Windings and Moldings for Transformer Core Pieces," to Balakrishnan, issued on Nov. 21, 1995, and U.S. Pat. No. 5,285,369, entitled "Switched Mode Power Supply Integrated Circuit with Start-up Self-biasing," to Balakrishnan, issued on Feb. 8, 1994, which are incorporated herein by reference. While Balakrishnan and other references have demonstrated noticeable improvements of incorporating power converters into an integrated circuit, an industry wide integration of higher voltage level devices (again, such as the switches of the power train) into the design of integrated circuits, especially in power converters, has not yet gained industry wide adoption.

Another issue in a design of the power converters is an increase of the switching frequency (e.g., five megahertz) of the power train thereof. The energy stored in reactive circuit elements (e.g., inductors and capacitors) associated with the power converter is inversely proportional to the switching frequency, and the size of the reactive circuit elements is also correspondingly inversely proportional to the switching frequency. A power converter is generally designed to switch at a frequency that does not compromise power conversion efficiency. Otherwise, the switching frequency could be simply increased with a consequent reduction in the size and cost of the power converter. Achieving a high switching frequency is dependent on reducing the parasitic circuit elements such as stray interconnection capacitance and inductance. As mentioned above, incorporating the low voltage devices and the higher voltage devices within an integrated circuit embodying the power converter can have a significant impact in reducing the interconnection paths and consequently the stray interconnection parasitic capacitance and inductance. Additionally, reducing the inherent parasitic losses in the switches of the power converter such as energy stored in a gate of a MOSFET can also have a significant impact on the switching frequency of the power converter.

Accordingly, what is needed in the art is an integrated circuit, semiconductor device and method of forming the same that incorporates low voltage devices and higher voltage devices on a semiconductor substrate that overcomes the deficiencies in the prior art. Additionally, there is a need in the art for a higher voltage device (e.g., a transistor such as a LDMOS device) that can accommodate higher voltages without excessive on-state resistance, and is capable of being integrated with low voltage devices on a semiconductor substrate in an integrated circuit that may form a power converter or portions thereof.

SUMMARY OF THE INVENTION

These and other problems are generally solved or circumvented, and technical advantages are generally achieved, by advantageous embodiments of the present invention, which includes an integrated circuit formed on a semiconductor substrate and configured to accommodate higher voltage devices and low voltage devices therein. In one embodiment, the integrated circuit includes a transistor advantageously embodied in a laterally diffused metal oxide semiconductor ("LDMOS") device having a gate located over a channel region recessed into a semiconductor substrate. The transistor also includes a source/drain including a lightly or heavily doped region adjacent the channel region, and an oppositely doped well extending under the channel region and a portion of the lightly or heavily doped region of the source/drain. The transistor still further includes a channel extension, within the oppositely doped well, under the channel region and extending under a portion of the lightly or heavily doped region of the source/drain. The transistor may be embodied in a semiconductor device with a complementary metal oxide semiconductor ("CMOS") device formed on the semiconductor substrate. The transistor may also form a driver switch of an integrated circuit. The integrated circuit may be employable with a power converter and the transistor operates as a power switch of a power train thereof or as a driver switch of a driver configured to provide a drive signal to the power switch of the power converter.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
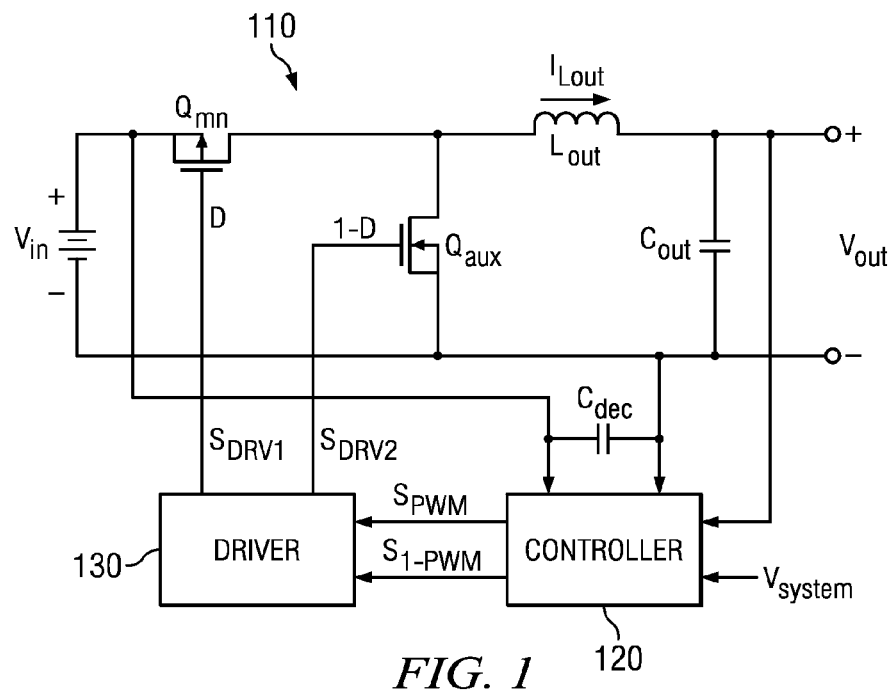
FIG. 1 illustrates a diagram of an embodiment of a power converter embodied in, or portions thereof, an integrated circuit constructed according to the principles of the present invention.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely, an integrated circuit including a transistor [e.g., embodied in a laterally diffused metal oxide semiconductor ("LDMOS") device] and methods of forming the same. While the principles of the present invention will be described in the environment of a power converter, any application that may benefit from a transistor that can accommodate higher voltages and is integrable with a low voltage device [e.g., complementary metal oxide semiconductor ("CMOS") device] on a semiconductor substrate is well within the broad scope of the present invention.

The advantages associated with incorporating the higher voltage LDMOS devices with the low voltage CMOS devices facilitate the ongoing incorporation of integrated circuits with higher levels of integration into more products such as power converters. For the purposes of the present invention, higher voltage devices refer to devices that can accommodate higher operating voltages than the standard operating voltages for a referenced low voltage device. As an example and in the context of CMOS technology, the higher voltage devices generally relate to devices that operate at voltages above a standard operating voltage for the selected CMOS devices (e.g., the low voltage devices). For instance, CMOS devices employing fine line structures having 0.25 micrometer line widths operate at or below about 2.5 volts. Thus, higher voltage devices generally include any devices operating above approximately 2.5 volts. In yet another context, the higher voltage devices also generally include devices that may exhibit a low level gate-to-source voltage limit (e.g., 2.5 volts) and, at the same time, can handle drain-to-source voltages above the gate-to-source voltage limit thereof (e.g., at least ten volts).

An area of ongoing development of semiconductor devices is obtaining a higher operating voltage for a transistor for a given semiconductor feature size without the need to produce a semiconductor chip with substantial active area. A number of processes and techniques have been developed to increase a drain breakdown voltage of an LDMOS. One process, a reduced surface field ("RESURF") process, increases the drain breakdown voltage by reducing a peak electric field between the drain and the gate or between the drain and the source. A general overview of the RESURF process is provided by A. Ludikhuize, in the paper entitled "A Review of RESURF Technology," Proceedings of IEEE ISPSD 2000, May 22, 2000, pp. 11-18, which is incorporated herein by reference. The LDMOS designs employing RESURF, however, often suffer from hot carrier injection ("HCI"), which may degrade the crystal structure of the device over time and thereby limit its long term reliability.

Another process to increase a drain breakdown voltage in an LDMOS, particularly for a short gate with a thin gate oxide, is the use of an extended drain structure. To form an extended drain structure, an implant is formed in a drain area with a tailored shape and doping density to raise the device breakdown voltage. As drain voltages continue to be increased in new designs (e.g., at least ten volts), however, an extended drain structure that can withstand the higher drain voltages does not provide a sufficiently low device on-state resistance to meet market challenges for new applications. The extended drain structure inherently increases the on-state resistance of the device, resulting in reduced efficiency of a power converter or other product employing the semiconductor device.

A further structure developed to provide increased drain voltage in an LDMOS is described by Bude, et al. ("Bude") in U.S. Pat. No. 7,262,476 entitled "Semiconductor Device Having Improved Power Density," issued Aug. 28, 2008, which is incorporated herein by reference. Bude describes a deep pocket implant in a drain region that reduces the device's maximum electric field strength. The deep pocket implant described by Bude, which must be located at a significant distance below a lightly doped drain ("LDD"), reduces hot carrier injection, but it also introduces alignment constraints for construction of the structure as well as substantial implementation expense.

As introduced herein, an implant is formed, preferably employing an ion implantation process, during an early stage of a die manufacturing process to produce a channel extension that enables a substantial reduction in drain length as well as a reduction of the distance between the gate and the drain. Formation of the implant may save as much as, without limitation, 30% of the active device area to achieve a particular transistor on-state resistance. The implant may be placed at a reasonable depth under a portion of a lightly doped region of the drain of the device (e.g., LDMOS device).

The channel extension may be a implant of the same doping type (i.e., N-doped or P-doped) as the channel region, and is located thereunder with a particular channel extension length. The doping specie such as boron, phosphorus, etc., may be different than the doping specie of the channel region. The channel extension produces a more conformal profile of the electric field in the channel and drain regions to reduce a peak electric field. By reducing the peak electric field, the length of a conventional LDD implant region does not need to be increased to withstand a high breakdown voltage, thereby reducing the on-state resistance for a given breakdown voltage. The choice of the channel extension dimensions (length and depth) and doping levels are selected to meet a breakdown voltage and resistance objective.

The implant to form the channel extension avoids alignment constraints introduced by Bude, and may be formed with two additional masking levels with little complexity and with associated cost savings. The channel extension does not require precise alignment to the gate. Accordingly, the implant step to form the channel extension can be done in a less controlled, less precise manner. Thus, the channel extension is more forgiving in terms of feature size control, and is simpler to form than the pocket of Bude. It fits well into the existing CMOS process flow, and can be fabricated in the presence of a background core complementary oxide semiconductor ("COS") process into which it fits in a modular fashion.

Forming an implant in an existing manufacturing process is an important consideration for low-cost compatibility with CMOS processes and with high levels of integration employable in applications such as advanced power management systems. In general, there is a set of process-related conditions for implants, diffusions, thermal cycles, etc., that are used in the construction of an integrated circuit and have a direct bearing on the restructuring of the extended drain. The objective is to stay reasonably compatible and consistent with these process-related conditions so as not to substantially change or increase the cost of the core CMOS processes.

The implant that forms the channel extension enables trade-offs necessary and/or desirable when the key parts of a core manufacturing process to produce a lightly doped drain well and drain dimensions, etc. are modified to accommodate a channel implement extension ("CIE") that results in improved transistor power density performance. The technology is selected around a power management set of transistor performance parameters. These transistor performance parameters include on-state resistance, parasitic capacitances, and switching times (turn-on and turn-off) from full current and voltage to zero current and voltage. Parameters that characterize the design of the channel extension include channel extension length, dose per square centimeter ("cm") to form the same and energy. A further parameter that characterizes the design of the channel extension is the dose applied to the semiconductor device to form the lightly doped drain.

Referring initially to FIG. 1, illustrated is a diagram of an embodiment of a power converter embodied in, or portions thereof, an integrated circuit constructed according to the principles of the present invention. The power converter includes a power train 110, a controller 120 and a driver 130, and provides power to a system such as a microprocessor. While in the illustrated embodiment, the power train 110 employs a buck converter topology, those skilled in the art should understand that other converter topologies such as a forward converter topology are well within the broad scope of the present invention.

The power train 110 of the power converter receives an input voltage $V_{in}$ from a source of electrical power (represented by a battery) at an input thereof and provides a regulated output voltage $V_{out}$ to power, for instance, a microprocessor at an output of the power converter. In keeping with the principles of a buck converter topology, the output voltage $V_{out}$ is generally less than the input voltage $V_{in}$ such that a switching operation of the power converter can regulate the output voltage $V_{out}$. A main switch $Q_{mn}$ [e.g., a P-channel metal oxide semiconductor field effect transistor ("MOSFET") embodied in a P-type laterally diffused metal oxide semiconductor ("P-LDMOS") device] is enabled to conduct for a primary interval (generally co-existent with a primary duty cycle "D" of the main switch $Q_{mn}$) and couples the input voltage $V_{in}$ to an output filter inductor $L_{out}$. During the primary interval, an inductor current $I_{Lout}$ flowing through the output filter inductor $L_{out}$ increases as current flows from the input to the output of the power train 110. An AC component of the inductor current $I_{Lout}$ is filtered by the output capacitor $C_{out}$.

During a complementary interval (generally co-existent with a complementary duty cycle "1-D" of the main switch $Q_{mn}$), the main switch $Q_{mn}$ is transitioned to a non-conducting state and an auxiliary switch $Q_{aux}$ [e.g., a N-channel MOSFET embodied in a N-type laterally diffused metal oxide semiconductor ("N-LDMOS") device] is enabled to conduct. The auxiliary switch $Q_{aux}$ provides a path to maintain a continuity of the inductor current $I_{Lout}$ flowing through the output filter inductor $L_{out}$. During the complementary interval, the inductor current $I_{Lout}$ through the output filter inductor $L_{out}$ decreases. In general, the duty cycle of the main and auxiliary switches $Q_{mn}$, $Q_{aux}$ may be adjusted to maintain a regulation of the output voltage $V_{out}$ of the power converter. Those skilled in the art should understand, however, that the conduction periods for the main and auxiliary switches $Q_{mn}$, $Q_{aux}$ may be separated by a small time interval to avoid cross conduction therebetween and beneficially to reduce the switching losses associated with the power converter.

The controller 120 of the power converter receives a desired characteristic such as a desired system voltage $V_{system}$ from an internal or external source associated with the microprocessor, and the output voltage $V_{out}$ of the power converter. The controller 120 is also coupled to the input voltage $V_{in}$ of the power converter and a return lead of the source of electrical power (again, represented by a battery) to provide a ground connection therefor. While only a single ground connection is illustrated in the present embodiment, those skilled in the art should understand that multiple ground connections may be employed for use within the controller 120. A decoupling capacitor $C_{dec}$ is coupled to the path from the input voltage $V_{in}$ to the controller 120. The decoupling capacitor $C_{dec}$ is configured to absorb high frequency noise signals associated with the source of electrical power to protect the controller 120.

In accordance with the aforementioned characteristics, the controller 120 provides a signal (e.g., a pulse width modulated signal $S_{PWM}$) to control a duty cycle and a frequency of the main and auxiliary switches $Q_{mn}$, $Q_{aux}$ of the power train 110 to regulate the output voltage $V_{out}$ thereof. The controller 120 may also provide a complement of the signal (e.g., a complementary pulse width modulated signal $S_{1-PWM}$) in accordance with the aforementioned characteristics. Any controller adapted to control at least one switch of the power converter is well within the broad scope of the present invention. As an example, a controller employing digital circuitry is disclosed in U.S. Pat. No. 7,038,438, entitled "Controller for a Power Converter and a Method of Controlling a Switch Thereof," to Dwarakanath, et al., issued May 2, 2006, and U.S. Pat. No. 7,019,505, entitled "Digital Controller for a Power Converter Employing Selectable Phases of a Clock Signal," to Dwarakanath, et al, issued Mar. 28, 2006, which are incorporated herein by reference.

The power converter also includes the driver 130 configured to provide drive signals $S_{DRV1}$, $S_{DRV2}$ to the main and auxiliary switches $Q_{mn}$, $Q_{aux}$, respectively, based on the signals $S_{PWM}$, $S_{1-PWM}$ provided by the controller 120. There are a number of viable alternatives to implement a driver 130 that include techniques to provide sufficient signal delays to prevent crosscurrents when controlling multiple switches in the power converter. The driver 130 typically includes switching circuitry incorporating a plurality of driver switches that cooperate to provide the drive signals $S_{DRV1}$, $S_{DRV2}$ to the main and auxiliary switches $Q_{mn}$, $Q_{aux}$. Of course, any driver 130 capable of providing the drive signals $S_{DRV1}$, $S_{DRV2}$ to control a switch is well within the broad scope of the present invention.

According to the principles of the present invention, the main and auxiliary switches $Q_{mn}$, $Q_{aux}$ are power switches that can be incorporated into a semiconductor device in an integrated circuit proximate control or signal processing devices that perform many of the control functions of the controller 120 of the power converter. As mentioned above, the control and signal processing devices are typically CMOS devices such as P-type metal oxide semiconductor ("PMOS") devices and N-type metal oxide semiconductor ("NMOS") devices (also generally referred to as a "CMOS device and another CMOS device," and vice-versa). The PMOS and NMOS devices may also be referred to as P-channel and N-channel MOSFETs, respectively. Lower voltages (e.g., 2.5 volts) are employed with the control and signal processing devices (hence, also referred to as "low voltage devices") to prevent breakdown between the fine line structures thereof.

The main and auxiliary switches $Q_{mn}$, $Q_{aux}$ of the power train 110, selected switches or other devices within the controller 120, and ones of the plurality of driver switches of the driver 130 are typically formed by LDMOS devices that handle higher voltages (e.g., at least ten volts) and hence are referred to as higher voltage devices. Integrating the control and signal processing devices, power switches and other switches (e.g., the driver switches) on a semiconductor substrate provides opportunities for substantial reductions in cost and size of an integrated circuit employable with a power converter or other apparatus employing like devices.

Additionally, when providing a drive signals $S_{DRV1}$, $S_{DRV2}$ to a switch (e.g., the main switch $Q_{mn}$) such as a P-channel MOSFET having a control voltage limit (i.e., a gate voltage limit) of 2.5 volts, and in the environment of a power converter having a nominal input voltage $V_{in}$ of five volts, the extended voltage range present on the gate terminal of the main switch $Q_{mn}$ may break down the integrity of the thin gate oxide thereof. In other words, when the input voltage $V_{in}$ to the power converter, which is translated into the drive signal $S_{DRV1}$ to the main switch $Q_{mn}$ under certain conditions as described above exceeds the gate voltage limit thereof, the main switch $Q_{mn}$ may be damaged and fail. Another layer of complexity arises when the plurality of driver switches of the driver 130 are referenced to a voltage level (e.g., a ground potential) and the main switch $Q_{mn}$ to be driven is referenced to another voltage (e.g., the input voltage $V_{in}$ to the power converter). Colloquially, the main switch $Q_{mn}$ of the power converter is referred to as a "floating" switch. A driver 130 for the power converter, therefore, should be capable of handling applications wherein the main switch $Q_{mn}$ to be driven exhibits a smaller control voltage limit (e.g., gate voltage limit) from the control terminal to another terminal (e.g., the gate terminal to the source terminal) thereof and is referenced to a voltage level different from the driver 130.

Figure 2:
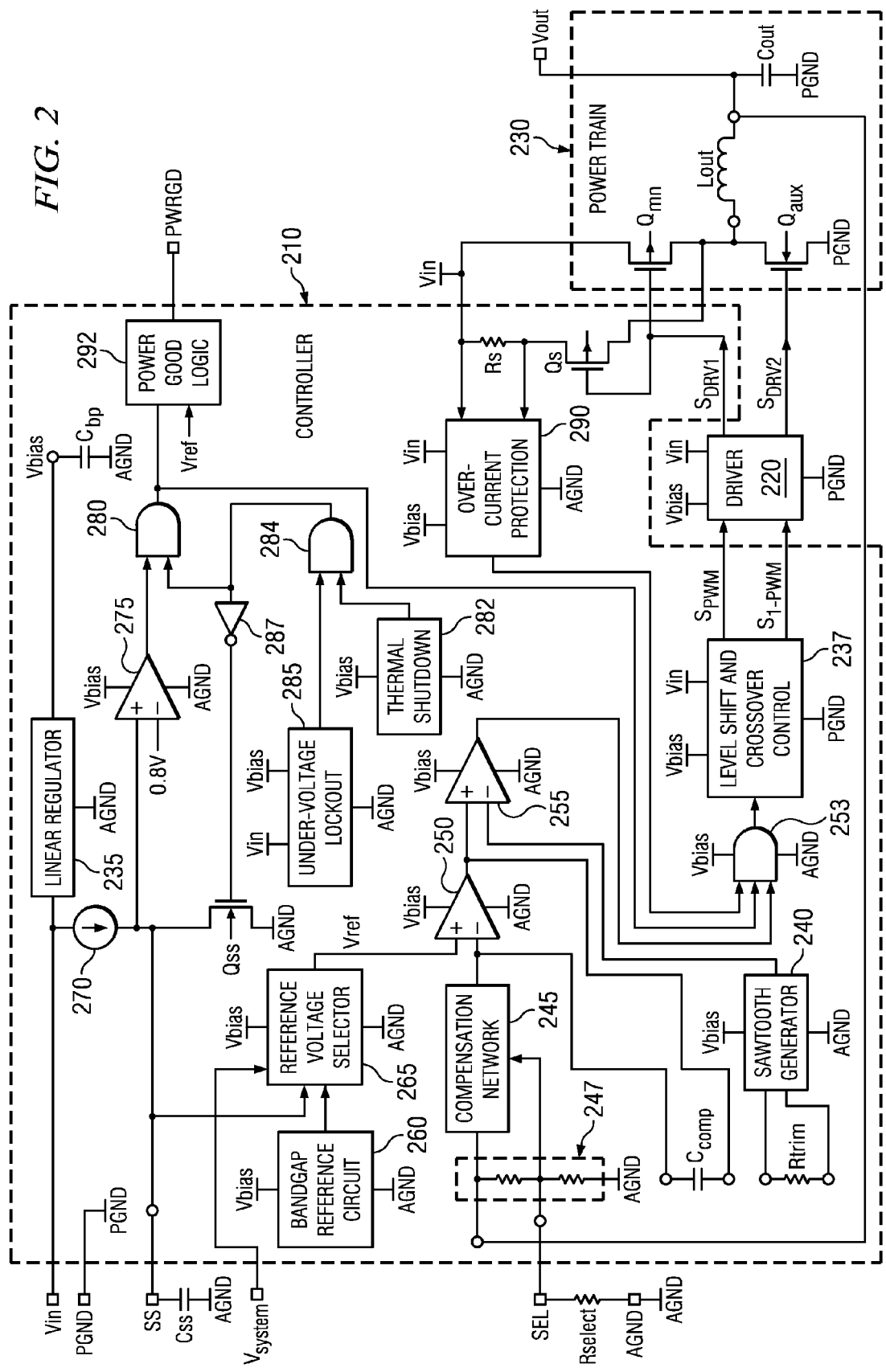
FIG. 2 illustrates a schematic diagram of an embodiment of a controller in an environment of a power converter embodied in, or portions thereof, an integrated circuit constructed according to the principles of the present invention.

Turning now to FIG. 2, illustrated is a schematic diagram of an embodiment of a controller in an environment of a power converter embodied in, or portions thereof, an integrated circuit constructed according to the principles of the present invention. The power converter includes a controller 210, a driver 220 and a power train 230. The controller 210 provides a signal (e.g., a pulse width modulated signal $S_{PWM}$) to control a duty cycle and a frequency of main and auxiliary switches $Q_{mn}$, $Q_{aux}$ of the power train 230 to regulate an output characteristic (e.g., an output voltage $V_{out}$) thereof. The controller 210 may also provide a complement of the signal (e.g., a complementary pulse width modulated signal $S_{1-PWM}$) via a level shift and crossover circuit 237. The level shift and crossover control circuit 237 is also adapted to adjust a delay between the signals $S_{PWM}$, $S_{1-PWM}$ that control the duty cycle of the main and auxiliary switches $Q_{mn}$, $Q_{aux}$ to substantially prevent a cross conduction and enhance the switching transitions therebetween.

The power train 230 employs a buck converter topology, which has been described above with respect to FIG. 1. The driver (e.g., a level shifting gate driver) 220 provides gate drive signals $S_{DRV1}$, $S_{DRV2}$ for the main and auxiliary switches $Q_{mn}$, $Q_{aux}$, and also for a sense switch (also referred to as a "switch in a controller 210 of the power converter," e.g., a P-channel MOSFET embodied in a P-LDMOS device, or also referred to as "another LDMOS device") $Q_s$. The sense switch $Q_s$ is configured to measure an output characteristic (e.g., an output current) of the power converter.

Figure 4:
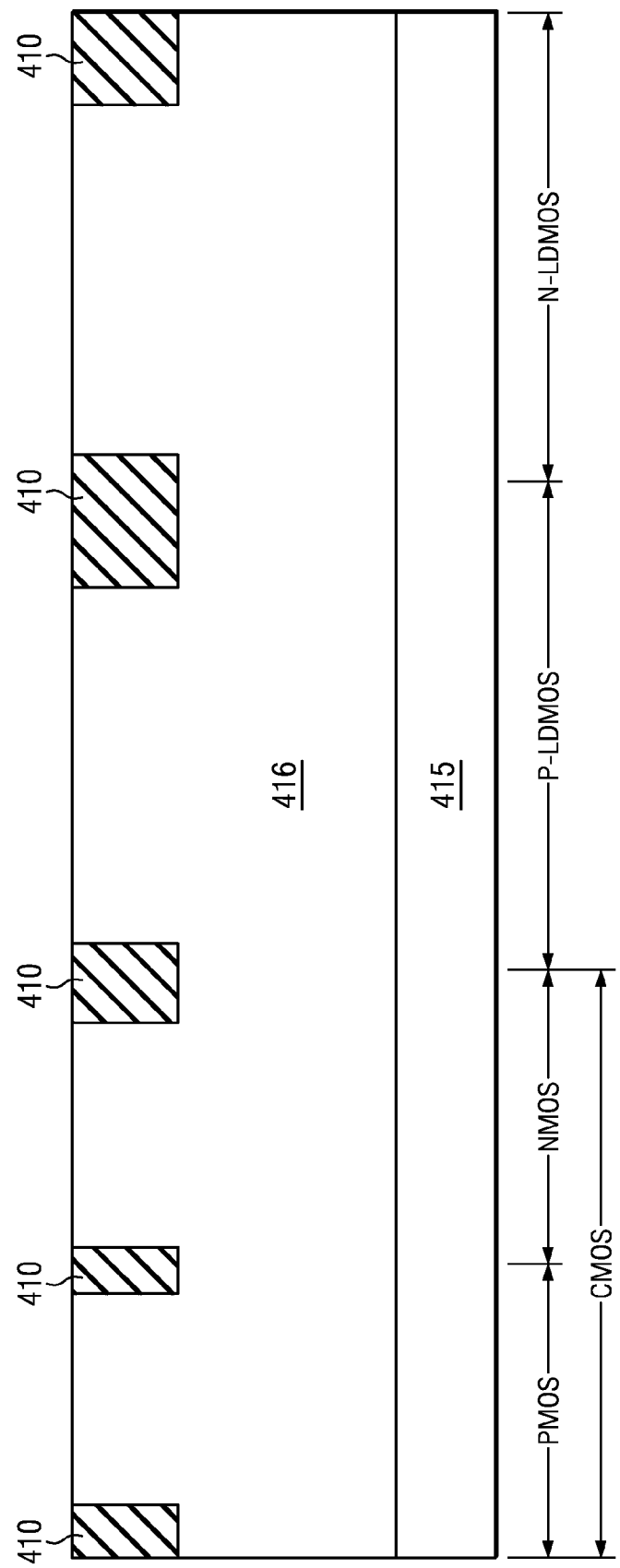
FIGS. 4 through 17 illustrate cross-sectional views of an embodiment of constructing a semiconductor device embodied in, or portions thereof, an integrated circuit according to the principles of the present invention.

The low voltage and higher voltage devices of the power converter may be embodied in a semiconductor device as illustrated and described with respect to FIG. 4, et seq. to form portions of a power converter embodied in an integrated circuit. Additionally, ones of the devices of the power converter such as an output inductor $L_{out}$ and output capacitor $C_{out}$ of the power train 230, and a soft-start capacitor $C_{ss}$ and a select resistor $R_{select}$ (which selects a set point for the output voltage $V_{out}$) associated with the controller 210 may be discrete devices incorporated into or with an integrated package with the semiconductor devices that embody other devices of the power converter and still remain within the broad scope of the present invention. The discrete devices are often employed with the power converter to provide application flexibility to allow for cost reductions and design options in constructing the power converter.

The controller 210 is coupled to the input voltage $V_{in}$ and the output voltage $V_{out}$ of the power converter and to first and second ground connections PGND, AGND. For a representative power converter, the input voltage $V_{in}$ is unregulated and falls within an operational range of 2.5 to 6.5 volts. The output voltage $V_{out}$ is well regulated (e.g., within a three percent tolerance) and can be adjusted between, for instance, 1.2 to 3.5 volts. The controller 210 of the power converter also receives a desired characteristic such as a desired system voltage $V_{system}$ from an internal or external source associated with, for instance, a microprocessor powered by the power converter.

A soft start operation of the power converter may be adjusted by a selection of a soft start capacitor $C_{ss}$, and the output voltage $V_{out}$ may be adjusted by the select resistor $R_{select}$. A signal indicating a normal operation of the power converter is provided via a power good connection PWRGD.

The active devices of the power converter are powered from the input voltage $V_{in}$ or from an internal, regulated voltage source, configured as a linear regulator 235 coupled to the input voltage $V_{in}$. The linear regulator 235 can be implemented as a dissipative regulator as hereinafter described.

As is well understood by those skilled in the art, the first and second ground connections PGND, AGND are representative of ground connections for the higher voltage devices handling higher currents and the low voltage devices handling low currents, respectively. The first ground connection PGND is for currents flowing in the higher voltage devices that are less sensitive to system noise. The second ground connection AGND is for currents flowing in the low voltage devices that are more sensitive to system noise. The first and second ground connections PGND, AGND are typically coupled at a single point within the power converter.

As described herein and, more specifically, with respect to FIG. 4, et seq. below, the low voltage devices are generally embodied in PMOS and NMOS devices, which may be integrable with the higher voltage devices, embodied in P-LDMOS and N-LDMOS devices in a semiconductor device. As a result, the power converter is more readily incorporated into an integrated circuit. Additionally, bias voltages $V_{bias}$ (which may be internally or externally generated) are resident throughout the controller 210. The higher voltage devices within the power converter operate from a higher voltage source such as the input voltage $V_{in}$, and the low voltage devices operate from a low voltage source, which is usually well regulated such as the bias voltages $V_{bias}$. The voltage source connections within the power converter are not intended to be exhaustive, but rather indicative of possible operational voltages for the particular devices of the power converter.

An exemplary operation of the controller 210 will hereinafter be described. A switching frequency of the power train 230 is generated by a sawtooth generator 240, which may be implemented using a current source to charge a capacitor coupled to a comparator (not shown). When the voltage of the capacitor exceeds a threshold value, the comparator enables a switch (not shown), quickly discharging the capacitor. The charge and discharge process regularly repeats, generating a sawtooth waveform for the voltage across the capacitor. To provide a consistent switching frequency, the sawtooth generator 240 is generally powered from an internal, regulated voltage source providing the bias voltage $V_{bias}$. A trim resistor $R_{trim}$ may be included to adjust the switching frequency during the design and manufacture of the controller 210. For a better understanding of sawtooth generators, see "The Art of Electronics," by Horowitz, et al., Cambridge University Press, Second Edition, pp. 288-291, 1989, the entire reference being incorporated herein by reference.

The output voltage $V_{out}$ is coupled through a compensation network 245 to a non-inverting input of an error amplifier 250 of the controller 210. Alternatively, the voltage representing the output voltage $V_{out}$ may be determined from a remote location in a distribution network and provided to the error amplifier 250. The error amplifier 250 is further compensated by a feedback network represented by a compensation capacitor $C_{comp}$. More extensive compensation networks can be provided as necessary for the error amplifier 250 as the application dictates. The compensation network 245 is coupled, via a select connection SEL, to the select resistor $R_{select}$, which is coupled to the second ground connection AGND. The select resistor $R_{select}$ provides an option to select the set point for the output voltage $V_{out}$ for the power converter.

The output of the error amplifier 250 is coupled to the non-inverting input of a comparator (e.g., a PWM comparator) 255 that compares the output of the error amplifier 250 with an output of the sawtooth generator 240. An output of the PWM comparator 255 is high during a primary interval when the main switch $Q_{mn}$ of the power train is configured to conduct. The output of the PWM comparator 255 is low during a complementary interval when the main switch $Q_{mn}$ of the power train is transitioned to a non-conducting state and the auxiliary switch $Q_{aux}$ is configured to conduct. A non-inverting input of the error amplifier 250 is coupled to a bandgap reference circuit 260 that supplies a well-regulated voltage (e.g., 1.07 volts) and a reference voltage selector 265. The reference voltage selector 265 provides a reference voltage $V_{ref}$ to the non-inverting input of the error amplifier 250 to establish a reference comparison for regulating the output voltage $V_{out}$ of the power converter.

The bandgap reference circuit 260 preferably uses bipolar CMOS technology and includes a disable pin (not shown) to disable an output therefrom. For example, when the disable pin is pulled high, the output from the bandgap reference circuit 260 can be pulled close to a ground potential with a switch (not shown), thereby disabling an operation of the power converter. The compensation network 245, as indicated above, is coupled to the select resistor $R_{select}$ to provide the set point for the output voltage $V_{out}$. The select resistor $R_{select}$ may be coupled and operative in parallel with a resistor in a voltage divider network 247 to control a fraction of the output voltage $V_{out}$ thereby further refining a set point for the output voltage $V_{out}$ for the power converter. The use of voltage dividers, in general, to alter set points is well understood in the art and will not herein be described.

A soft start operation of the power converter is controlled, in part, by a soft start capacitor $C_{ss}$. During a start up period of the power converter, the output voltage $V_{out}$ of the power converter is substantially zero, whereas during normal operation, a control loop of the controller 210 controls the conduction periods of the main and auxiliary switches $Q_{mn}$, $Q_{aux}$ to provide a regulated output voltage $V_{out}$. When the main switch $Q_{mn}$ is initially enabled to conduct and the auxiliary switch $Q_{aux}$ is non-conducting, a substantial in-rush current to the power converter may occur in accordance with the input voltage $V_{in}$ to charge the output capacitor $C_{out}$. This condition may produce a substantial overshoot of the output voltage $V_{out}$ as the output inductor $L_{out}$ and output capacitor $C_{out}$ resonantly ring in response to the in-rush current.

Thus, a slowly increasing set point for the control loop during the start up period is preferable and can be achieved by increasing a voltage across the soft start capacitor $C_{ss}$ at a controlled rate. During an initial operation of the power converter (and/or during a re-start operation), the soft start capacitor $C_{ss}$ is charged by a current source 270 (via a soft start connection SS), which is coupled to the reference voltage selector 265. The reference voltage selector 265 compares a voltage across the soft start capacitor $C_{ss}$ with a voltage provided by the bandgap reference circuit 260 and the system voltage $V_{system}$ and selects the smaller value therefrom. The resulting reference voltage $V_{ref}$ from the reference voltage selector 265 is provided to the non-inverting input of the error amplifier 250 to regulate the set point for the output voltage $V_{out}$ for the power converter.

Thus, during the soft start operation and when the voltage across the soft start capacitor $C_{ss}$ is smaller than the voltage of the bandgap reference circuit 260, the voltage across the soft start capacitor $C_{ss}$ controls and slowly ramps up according to the charging rate of the soft start capacitor $C_{ss}$. When the voltage across the soft start capacitor $C_{ss}$ exceeds the voltage from the bandgap reference circuit 260, the voltage from the bandgap reference circuit 260 provides the controlling signal for the reference voltage $V_{ref}$ to the error amplifier 250. As an example, the value of the soft start capacitor $C_{ss}$ is 15 nanofarads and the current source 270 provides about 10 microamperes of current. This combination results in a rate of increase of the voltage across the soft start capacitor of about 0.67 volts/millisecond. Inasmuch as an inverting input to a soft start comparator 275 is about, for instance, 0.8 volts, a time delay of about 1.2 milliseconds is sustained before a soft start AND gate 280 enables a switching operation of the power train 230 of the power converter. Of course, the period of delay can be altered by changing the value of the soft start capacitor $C_{ss}$ or the value of the current source 270.

The linear regulator 235 provides a well regulated, low voltage bias voltage $V_{bias}$ (e.g., 2.5 volts) to supply power for the low voltage devices having voltage limitations as generally determined by fine line semiconductor structures thereof. The linear regulator 235 is powered from the input voltage $V_{in}$ and is coupled to a bypass capacitor $C_{bp}$. The bypass capacitor $C_{bp}$ can be formed from a semiconductor device as described herein or by other device techniques and structures. Additional bypass capacitors $C_{bp}$ may be employed within the controller 210 and power converter, in general, to absorb system noise therein.

The linear regulator 235 preferably includes a higher voltage device implemented with an N-LDMOS device acting as a series-pass, regulating switch (not shown). An operational amplifier (not shown) is included in the linear regulator 235 that senses the bias voltage $V_{bias}$ and a reference voltage $V_{ref}$ such as provided by the bandgap reference circuit 260 to provide negative feedback to a control terminal of the series-pass, regulating switch, thereby providing voltage regulation for the bias voltage $V_{bias}$. The design of dissipative linear regulators 235 with a feedback control are well known in the art and will not herein be described. For a better understanding of the design of dissipative linear regulators 235, see chapter six of Horowitz, et al.

A number of circuits such as protection circuits within the controller 210 disable an operation of the power converter during unusual or undesirable operating conditions. The output of the circuits are combined via AND logic gates with an output from the PWM comparator 255 to disable the operation of the power converter when necessary. A thermal shutdown circuit 282 monitors a temperature of the power converter (e.g., a temperature of the switch embodied in a semiconductor device located on a semiconductor substrate) to protect, for example, against a possible low impedance circuit coupled inadvertently across an output of the power train 230. The temperature monitoring function can be provided using a voltage reference (not shown), which is dependent, preferably linearly, on the temperature of the monitored portion of the power converter. An output of the voltage reference is compared, for instance, with the output of the bandgap reference circuit 260 using a comparator (not shown) and, when there is a sufficient voltage difference therebetween, the comparator switches and provides a signal to a protection circuit AND gate 284.

The protection circuit AND gate 284 is also coupled to an under voltage lockout circuit 285 that compares the input voltage $V_{in}$ to a limiting threshold voltage and, when the input voltage $V_{in}$ is less than the threshold voltage, another signal is provided to the protection circuit AND gate 284. Thus, the output of the protection circuit AND gate 284 provides an indication of either a high temperature condition or an unacceptably low input voltage $V_{in}$ and disables the operation of the power converter accordingly. For further protection during a fault condition, when the main switch $Q_{mn}$ is transitioned to a non-conducting state, the auxiliary switch $Q_{aux}$ is enabled to conduct by the action of the level shifting gate driver 220, thereby discharging the output capacitor $C_{out}$ and providing further protection for the output voltage $V_{out}$ of the power converter. As an example, the under voltage lockout circuit 285 disables the operation of the power converter when the input voltage $V_{in}$ is less than 2.5 volts. When the input voltage $V_{in}$ is less than about 2.6 volts, the linear regulator 235 saturates "full on" and may lose its regulation capability, causing a drop in the bias voltage $V_{bias}$. A sufficient voltage compliance, however, can be designed into the various devices in the power converter to enable proper operation when the bias voltage $V_{bias}$ is slightly less than the desired regulated value.

An output of the protection circuit AND gate 284 is also coupled to a soft start switch $Q_{ss}$ through an inverter 287. The purpose of the soft start switch $Q_{ss}$ is to discharge the soft start capacitor $C_{ss}$ whenever a temperature within the power converter exceeds a limit or the input voltage $V_{in}$ is below a safe operating point for the power train 230. Discharging the soft start capacitor $C_{ss}$ essentially sets the set point for the output voltage $V_{out}$ for the power train 230 to zero. The soft start capacitor $C_{ss}$ may also be discharged by a circuit external to the power converter, such as by an external switch, to disable an operation of the power converter based on external system requirements.

The protection circuit AND gate 284 provides an input to the soft start AND gate 280, which is also coupled to the soft start comparator 275. The soft start AND gate 280 monitors an output of the soft start comparator 275, which is coupled to the soft start capacitor $C_{ss}$. The soft start AND gate 280 is coupled to a PWM AND gate 253 and configured to disable the power train 230 whenever a voltage across the soft start capacitor $C_{ss}$ is less than a threshold value. In the present embodiment, the threshold value, coupled to inverting input of the soft start comparator 275, is preferably about 0.8 volts. The threshold value may be derived from the bandgap reference circuit 260. Thus, a soft start circuit of the controller 210 includes, among other things, the soft start capacitor $C_{ss}$, the soft start switch $Q_{ss}$ and the soft start comparator 275.

The controller 210 also includes other protective circuits such as an over current protection circuit 290. A sense switch $Q_s$ is coupled in parallel with the main switch $Q_{mn}$ of the power train 230 and is controlled to conduct synchronously with the main switch $Q_{mn}$. A sense resistor $R_s$ is coupled in series with the sense switch $Q_s$. Thus, a current that flows through the sense resistor $R_s$ is a fraction of the current flowing through the main switch $Q_{mn}$ when the main switch $Q_{mn}$ conducts. A voltage proportional to the sensed current is amplified by an operational amplifier (not shown) in the over current protection circuit 290 and compared to a threshold value. If the threshold value of the current through the sense resistor $R_s$ is exceeded, a disable signal is provided to the PWM AND gate 253. Thus, the over current protection circuit 290 can disable the operation of the power train 230 whenever current through the main switch $Q_{mn}$, which also generally flows through the output inductor $L_{out}$, exceeds a threshold value.

A power good monitoring circuit 292 is coupled to the output of the soft start AND gate 280, and preferably provides a signal to the power good connection PWRGD of the power converter to provide an external indication that the power converter is operating normally. In addition, the power good monitoring circuit 292 is also coupled to the reference voltage $V_{ref}$ from the reference voltage selector 265. When the output of the reference voltage selector 265 is above a predetermined reference voltage level and the output of the soft start AND gate 280 is high, the output of the power good monitoring circuit 292 is high to indicate a normal operation of the power converter. It should be understood that circuits that monitor internal voltages and the outputs of logic gates are generally well known in the art. It should further be understood that circuits that monitor the operation of a power converter can be optionally coupled to various operating points within the controller 210 and the power train 230 of the power converter.

Thus, a power converter embodied in, or portions thereof, an integrated circuit has been illustrated and described with respect to FIG. 2. As described above, the devices of the power converter may be constructed with low voltage devices and higher voltage devices integrable in a semiconductor device using fine line processing. Thus, for reasons as stated below, not only can control and signal processing devices, but higher voltage devices such as the switches of the driver and power train, can be integrated into a semiconductor device thereby further facilitating the power converter incorporated into an integrated circuit.

Figure 3:
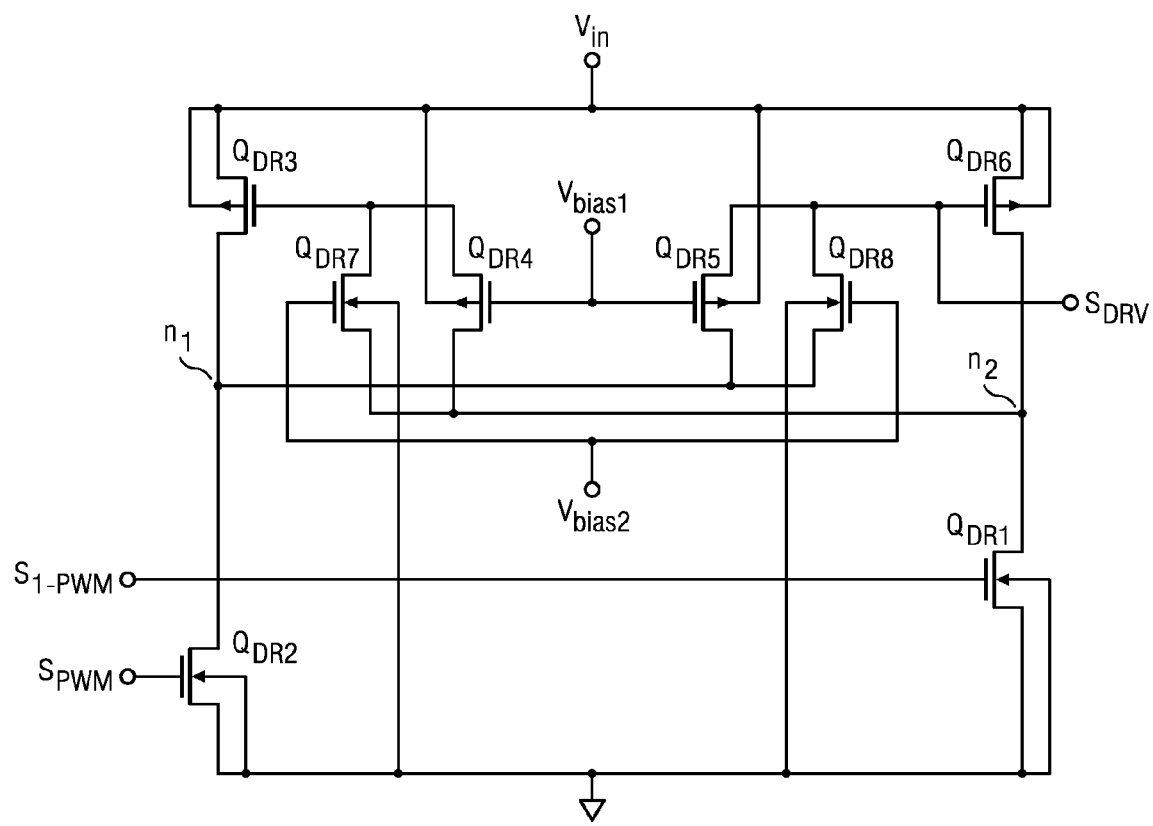
FIG. 3 illustrates a schematic diagram of an embodiment of a driver of a power converter embodied in, or portions thereof, an integrated circuit constructed according to the principles of the present invention.

Turning now to FIG. 3, illustrated is a schematic diagram of an embodiment of a driver of a power converter embodied in, or portions thereof, an integrated circuit constructed according to the principles of the present invention. The driver is adapted to provide a drive signal $S_{DRV}$ to control a switch having a control voltage limit. More specifically and in the illustrated embodiment, the driver is a gate driver that provides a gate drive signal $S_{DRV}$ to, for instance, a P-channel MOSFET that exhibits a gate voltage limit (i.e., a gate-to-source voltage limit) of 2.5 volts. The gate driver receives a signal (e.g., a pulse width modulated signal $S_{PWM}$) from a controller (see, for instance, the controller 120 illustrated and described with respect to FIG. 1) and a complement of the signal (e.g., a complementary pulse width modulated signal $S_{1-PWM}$) from the controller. Additionally, the gate driver may provide a first gate drive signal and a second gate drive signal to drive multiple switches such as the main and auxiliary switches $Q_{mn}$, $Q_{aux}$ of a power converter as described above. For purposes of the following discussion, however, the driver will be described and is adapted to provide a gate drive signal $S_{DRV}$.

The gate driver includes switching circuitry formed by a plurality of driver switches such as first, second, third, fourth, fifth, sixth, seventh and eighth driver switches $Q_{DR1}$, $Q_{DR2}$, $Q_{DR3}$, $Q_{DR4}$, $Q_{DR5}$, $Q_{DR6}$, $Q_{DR7}$, $Q_{DR8}$ coupled to a source of electrical power for the power converter and the controller of the power converter. The gate driver is also coupled to a first bias voltage source that provides a first bias voltage $V_{bias1}$, which may be internally or externally generated and may depend on an input voltage $V_{in}$ of the power converter. For purposes of the discussion herein, it is assumed that the first, second, third, fourth, fifth, sixth, seventh and eighth driver switches $Q_{DR1}$, $Q_{DR2}$, $Q_{DR3}$, $Q_{DR4}$, $Q_{DR5}$, $Q_{DR6}$, $Q_{DR7}$, $Q_{DR8}$ have a low gate voltage limit and a higher voltage drain. Thus, the first, second, third, fourth, fifth, sixth, seventh and eighth driver switches $Q_{DR1}$, $Q_{DR2}$, $Q_{DR3}$, $Q_{DR4}$, $Q_{DR5}$, $Q_{DR6}$, $Q_{DR7}$, $Q_{DR8}$ may exhibit a low gate voltage limit (e.g. 2.5 volts) and at the same time handle drain-to-source voltages above the gate voltage limit thereof (e.g., at least ten volts).

To simplify the discussion, it is also assumed that the first, second, third, fourth, fifth, sixth, seventh and eighth driver switches $Q_{DR1}$, $Q_{DR2}$, $Q_{DR3}$, $Q_{DR4}$, $Q_{DR5}$, $Q_{DR6}$, $Q_{DR7}$, $Q_{DR8}$ exhibit a gate threshold voltage of about is 0.5 volts, which is consistent with a number of fine feature size, low voltage MOSFET designs. The gate threshold voltage provides a voltage level above or below which (depending on the type) the first, second, third, fourth, fifth, sixth, seventh and eighth driver switches $Q_{DR1}$, $Q_{DR2}$, $Q_{DR3}$, $Q_{DR4}$, $Q_{DR5}$, $Q_{DR6}$, $Q_{DR7}$, $Q_{DR8}$ are enabled to conduct.

In the illustrated embodiment, the first, second, seventh and eighth driver switches $Q_{DR1}$, $Q_{DR2}$, $Q_{DR7}$, $Q_{DR8}$ are N-channel MOSFETs and the third, fourth, fifth and sixth driver switches $Q_{DR3}$, $Q_{DR4}$, $Q_{DR5}$, $Q_{DR6}$ are P-channel MOSFETs. The drain terminals of the second, third and fifth driver switches $Q_{DR2}$, $Q_{DR3}$, $Q_{DR5}$ are coupled together at a first node $n_1$. The drain terminals of the first, fourth and sixth driver switches $Q_{DR1}$, $Q_{DR4}$, $Q_{DR6}$ are coupled together at a second node $n_2$. While each of the first, second, seventh and eighth driver switches $Q_{DR1}$, $Q_{DR2}$, $Q_{DR7}$, $Q_{DR8}$ are illustrated with gate, source and drain terminals, it is also common for each of the first, second, seventh and eighth driver switches $Q_{DR1}$, $Q_{DR2}$, $Q_{DR7}$, $Q_{DR8}$ to include a body terminal.

The gate driver is coupled between an input voltage $V_{in}$ (e.g., an unregulated input voltage at a nominal five volts) of the power converter and ground, with a potential difference therebetween for the purposes of this discussion of five volts. The source terminal of the third and sixth driver switches $Q_{DR3}$, $Q_{DR6}$ are coupled to the input voltage $V_{in}$. The first bias voltage $V_{bias1}$, assumed for this discussion to be 2.5 volts with respect to the ground, is coupled to the gate terminal of the fourth and fifth driver switches $Q_{DR4}$, $Q_{DR5}$, and a return connection of the first bias voltage source is coupled to the ground. The first bias voltage source may or may not be derived from the source of electrical power that provides the input voltage $V_{in}$, depending on the application for the gate driver.

As illustrated, the seventh and eighth driver switches $Q_{DR7}$, $Q_{DR8}$ are parallel coupled to the fourth and fifth driver switches $Q_{DR4}$, $Q_{DR5}$, respectively. The seventh and eighth driver switches $Q_{DR7}$, $Q_{DR8}$ include a higher voltage source and a higher voltage drain and typically exhibit a higher source-to-gate voltage handling capability (e.g., five volts) when the source is more positive than the gate and at the same time handle drain-to-source voltages above the low gate voltage limit thereof. The gate terminal of the seventh and eighth driver switches $Q_{DR7}$, $Q_{DR8}$ are coupled together and to a second voltage bias source that provides a second bias voltage $V_{bias2}$, which may be internally or externally generated and may depend on an input voltage $V_{in}$ of the power converter.

The gate driver, in the illustrated embodiment, can operate in a couple of different modes of operation. For instance, when the input voltage $V_{in}$ to the power converter is greater than an upper gate voltage limit for a main switch $Q_{mn}$ such as a P-channel MOSFET (see, as an example, the power train of the power converter illustrated and described with respect to FIG. 1) driven by the gate driver, then voltage protective features of the gate driver are enabled.

More specifically, when the pulse width modulated signal $S_{PWM}$ provided to the second driver switch $Q_{DR2}$ is high (i.e., when the pulse width modulated signal $S_{PWM}$ is more positive than the gate threshold voltage of 0.5 volts), the first node $n_1$ that couples the drain terminals of the second and third driver switches $Q_{DR2}$, $Q_{DR3}$ is pulled low by the second driver switch $Q_{DR2}$. The drain terminal of the fifth driver switch $Q_{DR5}$ is also coupled to the first node $n_1$ and the gate terminal thereof is coupled to the first bias voltage source. Thus, the source of the fifth driver switch $Q_{DR5}$ is pulled down to three volts (i.e., one gate threshold voltage value more positive than the first bias voltage $V_{bias1}$). The gate drive signal $S_{DRV}$ is therefore pulled down two volts below the input voltage $V_{in}$, which is a sufficient voltage to enable a switch such as the main switch $Q_{mn}$, a P-channel MOSFET, illustrated and described with respect to the power train of the power converter of FIG. 1 to conduct.

When the complementary pulse width modulated signal $S_{1-PWM}$ provided to the first driver switch $Q_{DR1}$ is more positive than the gate threshold voltage, the first driver switch $Q_{DR1}$ is enabled to conduct and the second node $n_2$ is pulled down to substantially the ground voltage by an on-resistance of the first driver switch $Q_{DR1}$. The gate of the third driver switch $Q_{DR3}$ is pulled down to about three volts (i.e., one gate threshold voltage value more positive than the first bias voltage $V_{bias1}$). Thus, the third driver switch $Q_{DR3}$ is enabled to conduct and the drain thereof, coupled to first node $n_1$, is pulled up substantially to the input voltage $V_{in}$. The fifth driver switch $Q_{DR5}$ is now enabled to conduct because the gate voltage is more than one gate threshold voltage more negative than the drain thereof, and the source of the fifth driver switch $Q_{DR5}$ is pulled up substantially to the input voltage $V_{in}$. Therefore, the gate drive signal $S_{DRV}$ from the gate driver is also pulled up to substantially the input voltage $V_{in}$, which is a sufficient voltage to transition a switch such as the main switch $Q_{mn}$, a P-channel MOSFET, illustrated and described with respect to the power train of the power converter of FIG. 1 to a non-conducting state.

Accordingly, a type of level shifting gate driver has been introduced with an improved level-shifting capability that can controllably raise the gate voltage of an exemplary switch (e.g., a P-channel MOSFET) to substantially the input voltage $V_{in}$ to transition the switch to a non-conducting state, and controllably reduce the gate voltage to a lower voltage to enable the switch to conduct. Inasmuch as the gate terminal of the fifth driver switch $Q_{DR5}$ is coupled to the first bias voltage source, the fifth driver switch $Q_{DR5}$ is transitioned to a non-conducting state when a voltage present on its source is less than the first bias voltage $V_{bias1}$ plus its gate threshold voltage (treating the gate threshold voltage of a P-channel MOSFET as a positive number). If the gate driver properly applies the first bias voltage $V_{bias1}$ (e.g., if the first bias voltage $V_{bias1}$ is the input voltage $V_{in}$ minus 2.5 volts and adjusted for the gate threshold voltage of the fifth driver switch $Q_{DR5}$), the gate drive signal $S_{DRV}$ will not decrease more than 2.5 volts below input voltage $V_{in}$ thereby not exceeding the gate voltage limit of the switch to be driven. The first bias voltage $V_{bias1}$, therefore, is preferably dependent on the input voltage $V_{in}$. The gate terminal of the switch (again, a P-channel MOSFET) coupled to the gate driver will thus be protected by the gate driver and, in particular, by the fifth driver switch $Q_{DR5}$, which operatively provides a protective voltage limiting function. Finally, the gate driver is symmetrical and as the pulse width modulated signal $S_{PWM}$ and complementary pulse width modulated signal $S_{1-PWM}$ alternate, the conduction states and voltages within the gate driver alternate accordingly.

Additionally, in this mode of operation, the second bias voltage $V_{bias2}$ provided to the gate terminals of the seventh and eighth driver switches $Q_{DR7}$, $Q_{DR8}$ is at a ground potential. Since the source terminals of the seventh and eighth driver switches $Q_{DR7}$, $Q_{DR8}$ are not coupled to a potential at or below the ground potential, the seventh and eighth driver switches $Q_{DR7}$, $Q_{DR8}$ are not enabled to conduct as a consequence of the grounded gate terminals thereof. Thus, under the aforementioned circumstances, the seventh and eighth driver switches $Q_{DR7}$, $Q_{DR8}$ have little effect on the operation of the gate driver.

In another operating mode for the gate driver (enabled by the seventh and eighth driver switches $Q_{DR7}$, $Q_{DR8}$), the input voltage $V_{in}$ to the power converter is not greater than an upper gate voltage limit for a main switch $Q_{mn}$ such as a P-channel MOSFET (see, as an example, the power train of the power converter illustrated and described with respect to FIG. 1) driven by the gate driver, then voltage protective features of the gate driver are not necessary. In this mode of operation, the clamping operation of the fifth driver switch $Q_{DR5}$ on the gate drive signal $S_{DRV}$ is inoperative. More specifically, the gate terminal of the seventh and eighth driver switches $Q_{DR7}$, $Q_{DR8}$ are coupled to a suitably high potential such as the input voltage $V_{in}$. As a result, the seventh and eighth driver switches $Q_{DR7}$, $Q_{DR8}$ are enabled to conduct. Thus, the gate drive signal $S_{DRV}$ is coupled to ground potential by an on resistance of the second and eighth driver switches $Q_{DR2}$, $Q_{DR8}$ when the main switch $Q_{mn}$, a P-channel MOSFET as discussed above, driven by the gate driver is enabled to conduct. The gate driver, therefore, selectively provides additional flexibility by altering a voltage applied to an input thereof, consequently accommodating an input voltage $V_{in}$ above or below a gate voltage limit of a switch driven therefrom. Additionally, for a more detailed analysis of this embodiment of the driver, see U.S. Pat. No. 7,330,017, entitled "Driver for a Power Converter and Method of Driving a Switch Thereof," to Dwarakanath, et al., issued Feb. 12, 2008, which is incorporated herein by reference.

Turning now to FIGS. 4 through 17, illustrated are cross-sectional views of an embodiment of constructing a semiconductor device embodied in, or portions thereof, an integrated circuit according to the principles of the present invention. Beginning with FIG. 4, illustrated is a cross-sectional view of an embodiment of a partially completed semiconductor device including isolation regions (e.g., shallow trench isolation regions) 410 constructed in accordance with one or more aspects of the present invention. In accordance with standard practices in the semiconductor industry, various features in this and subsequent drawings are not drawn to scale. The dimensions of the various features may be arbitrarily increased or decreased for clarity of the discussion herein and like reference numbers may be employed for analogous features of different devices that make up the semiconductor device.

The semiconductor device includes a semiconductor substrate (also referred to as a "substrate") 415 and grown on a surface thereof is an epitaxial layer (e.g., a P-type epitaxial layer) 416, preferably doped between $1 \cdot 10^{14}$ and $1 \cdot 10^{16}$ atoms/cm$^3$. The epitaxial layer 416 may not be needed, particularly if the substrate 415 is a lightly doped P-type. Although in the illustrated embodiment, the substrate 415 is a P-type substrate, one skilled in the art understands that the substrate 415 could be an N-type substrate, without departing from the scope of the present invention.

The substrate 415 is divided into four dielectrically separated areas to accommodate, in the illustrated embodiment, four transistors (e.g., MOSFETs) located thereon. More specifically, the substrate 415 can accommodate a PMOS device and a NMOS device that operate as low voltage devices within, for instance, a controller of a power converter (i.e., the control and signal processing devices). Additionally, the substrate 415 can accommodate a P-LDMOS device and a N-LDMOS device (also generally referred to as a "LDMOS device and another LDMOS device," and vice-versa) that operate as higher voltage devices within, for instance, a power train and driver of a power converter (i.e., the power switches and driver switches).

The shallow trench isolation regions 410 are formed within the epitaxial layer 416 of the substrate 415 to provide dielectric separation between the devices implemented on the substrate 415. The shallow trench isolation regions 410 are formed by masking the substrate 415 and using a photoresist to define the respective regions therein. The shallow trench isolation regions 410 are then etched and backfilled with a dielectric such as silicon dioxide, silicon nitride, a combination thereof, or any other suitable dielectric material. Then, the epitaxial layer of the substrate 415 and the shallow trench isolation regions 410 are planarized by a lapping process. The steps of masking, etching, backfilling with the dielectric and lapping are well known in the art and will not hereinafter be described in further detail.

Figure 5:
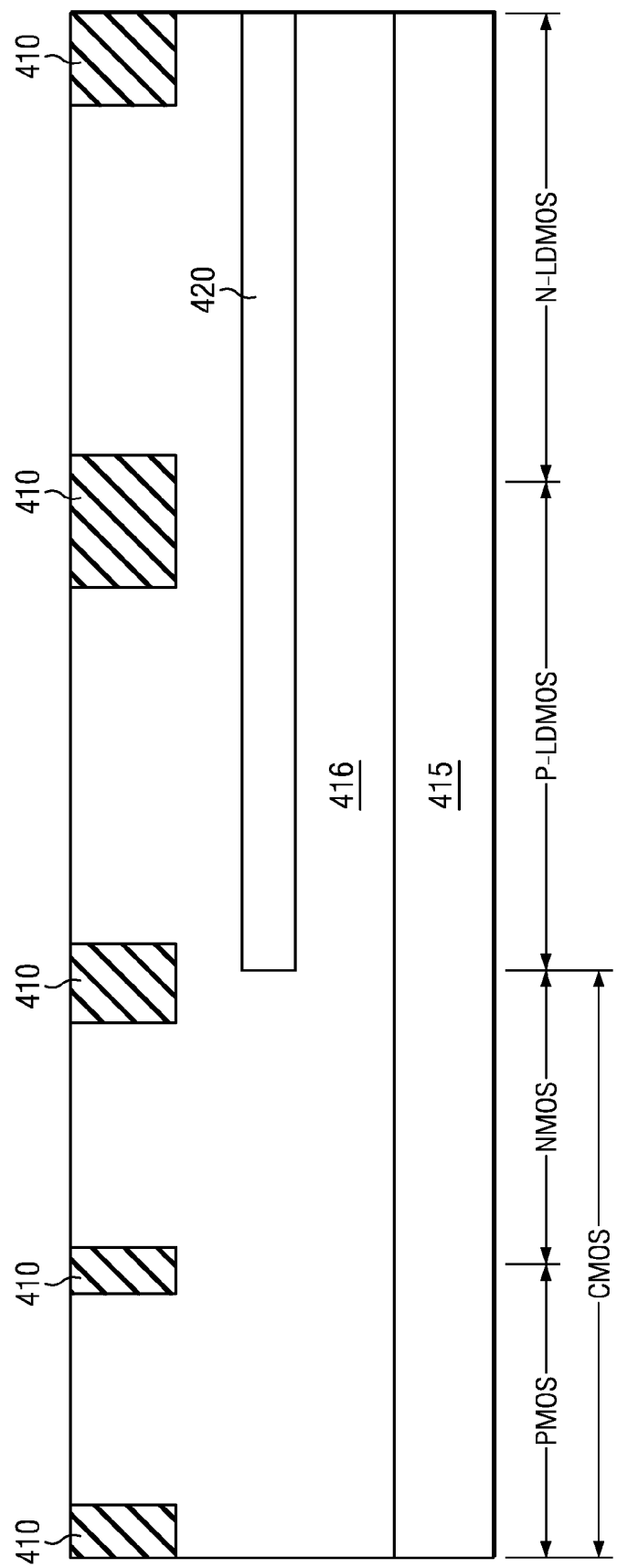

Turning now to FIG. 5, illustrated is a cross-sectional view of an embodiment of a partially completed semiconductor device including a buried layer (e.g., an N-type buried layer, also generally referred to as an "oppositely doped buried layer") 420 constructed in accordance with one or more aspects of the present invention. As illustrated, the N-type buried layer 420 is recessed within the epitaxial layer 416 of the substrate 415 in the area that accommodates the P-LDMOS device and the N-LDMOS device. The N-type buried layer 420 is formed by a deep ion implantation process (e.g., at a controlled voltage of about 200 kiloelectronvolts) of an appropriate dopant specie such as arsenic or phosphorus and results in a doping concentration profile, preferably in a range of $1 \cdot 10^{18}$ to $1 \cdot 10^{20}$ atoms/cm$^3$. The N-type buried layer 420 is preferably located approximately one micrometer below a top surface of the epitaxial layer 416 of the substrate 415, and is annealed (e.g., at 600 to 1200 degrees Celsius) as necessary to provide the proper distribution of the implanted ion specie. A lateral location of the N-type buried layer 420 is controlled by a photoresist mask using techniques well known in the art. The steps of masking, ion implanting and annealing are well known in the art and will not hereinafter be described in further detail.

Figure 6:
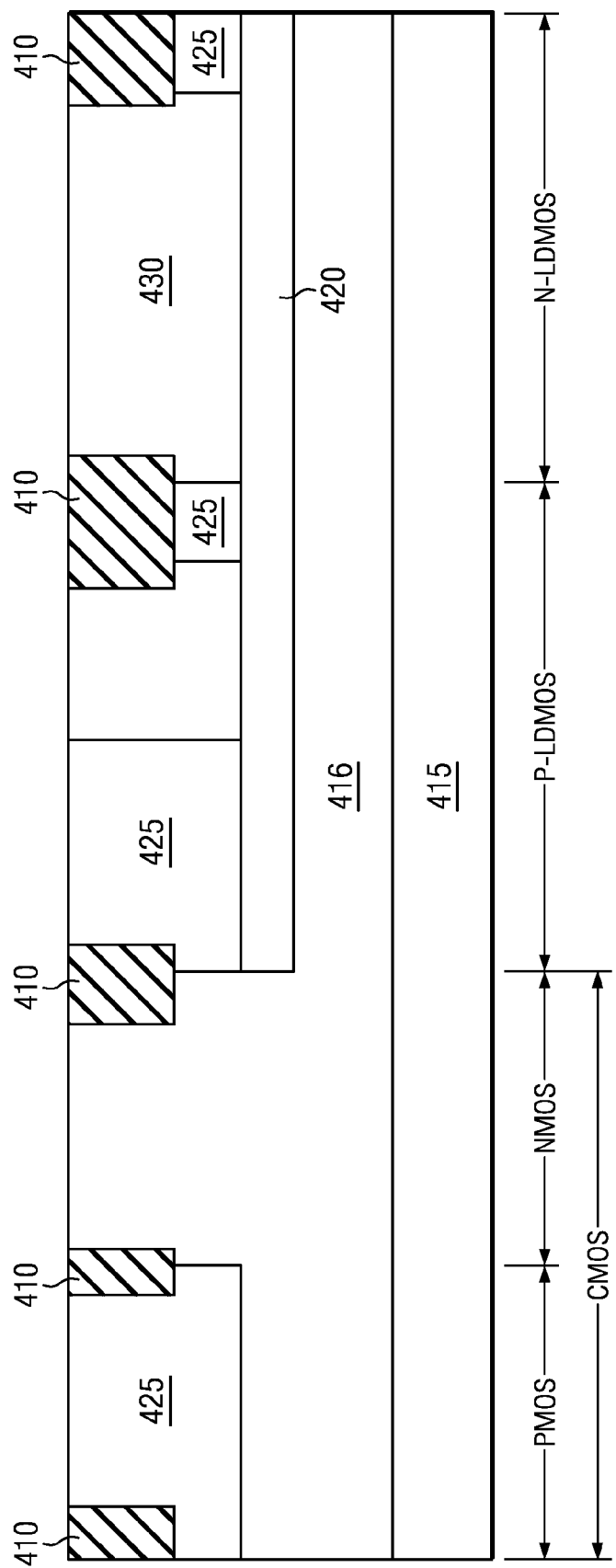

Turning now to FIG. 6, illustrated is a cross-sectional view of an embodiment of a partially completed semiconductor device including wells (e.g., N-type wells, also generally referred to as an "oppositely doped wells") 425 constructed in accordance with one or more aspects of the present invention. The N-type wells 425 are constructed with similar doping concentration profiles employing an ion implantation process. The N-type wells 425 are formed in the epitaxial layer 416 of the substrate 415 in the areas that accommodate the PMOS device and the P-LDMOS device, and under the shallow trench isolation regions 410 above the N-type buried layer 420 (for the P-LDMOS). The N-type wells 425 are formed to provide electrical isolation for the PMOS device and the P-LDMOS device and operate cooperatively with the N-type buried layer 420 (in the case of the P-LDMOS device) and the shallow trench isolation regions 410 to provide the isolation.

A photoresist mask defines the lateral areas for the ion implantation process. After the ion implantation process, the implanted specie is diffused by annealing the substrate 415 at elevated temperature. An appropriate dopant specie such as arsenic or phosphorus can be used to form the N-type wells 425, preferably, but without limitation, in a retrograde doping concentration profile with approximately $1 \cdot 10^{17}$ atoms/cm$^3$ in the middle, and a higher doping concentration profile at the surface as well as at the bottom. The steps of masking, ion implanting and annealing are well known in the art and will not hereinafter be described in further detail.

A width of the N-type wells 425 may vary depending on the particular devices and application and, as one skilled in the art knows, may be laterally defined by the photoresist mask. For instance, the N-type well 425 above the N-type buried layer 420 does not cover the entire area that accommodates the P-LDMOS device in the epitaxial layer 416 of the substrate 415 between the shallow trench isolation regions 410 thereof.

The advantages of forming the N-type well 425 in the epitaxial layer 416 of the substrate 415 within a portion of the area that accommodates the P-LDMOS device will become more apparent for the reasons as set forth below.

Figure 7:
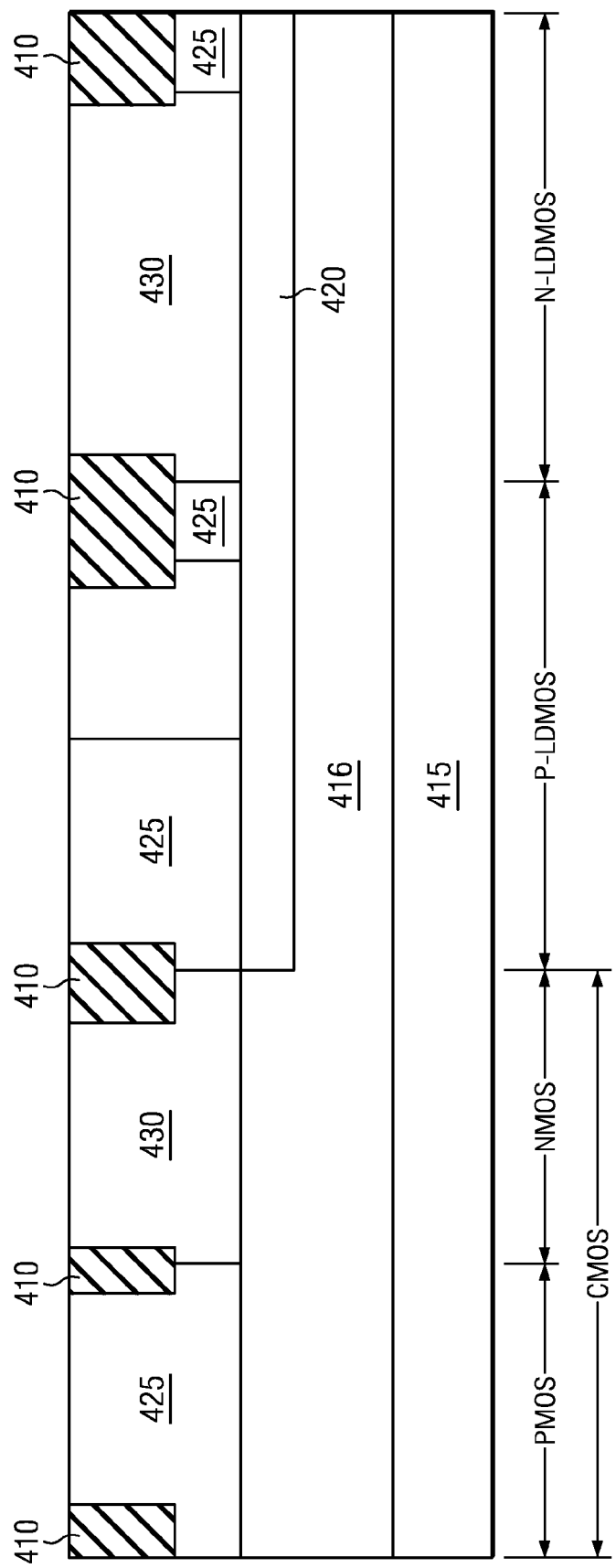

Turning now to FIG. 7, illustrated is a cross-sectional view of an embodiment of a partially completed semiconductor device including wells (e.g., P-type wells, also generally referred to as an "oppositely doped wells") 430 constructed in accordance with one or more aspects of the present invention. The P-type wells 430 are formed with similar doping concentration profiles by ion implantation process of an appropriate specie such as boron. The P-type wells 430 are formed in the epitaxial layer 416 of the substrate 415 between the shallow trench isolation regions 410 substantially in the areas that accommodate the NMOS device and N-LDMOS device. A photoresist mask defines the lateral areas for the ion implantation process. After the ion implantation process, the implanted specie is diffused by annealing the substrate 415 at an elevated temperature.

Again, an appropriate dopant specie such as boron can be used to form the P-type wells 430, preferably resulting in a retrograde doping concentration profile with approximately $1 \cdot 10^{17}$ atoms/cm$^3$ in the middle, and a higher doping concentration profile at the top surface as well as at the bottom. The steps of masking, ion implanting and annealing are well known in the art and will not hereinafter be described in further detail. Analogous to the N-type wells 425, a width of the P-type wells 430 may vary depending on the particular devices and application and, as one skilled in the art knows, may be laterally defined by the photoresist mask. For instance, while the P-type well 430 above the N-type buried layer 425 covers the entire area that accommodates the N-LDMOS device in the epitaxial layer 416 of the substrate 415 between the shallow trench isolation regions 410 thereof, it is well within the broad scope of the present invention to define the P-type well 430 to cover a portion of the area that accommodates the N-LDMOS device in the epitaxial layer 416 of the substrate 415.

Figure 8:
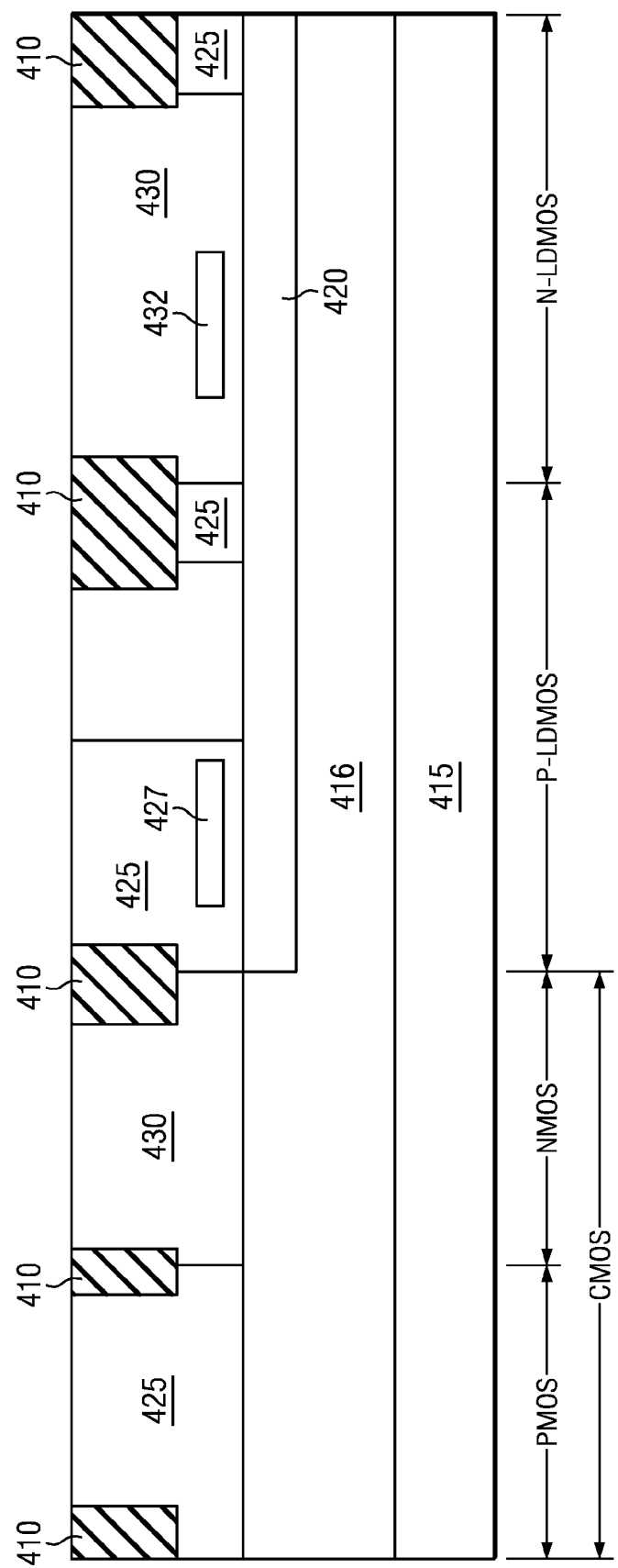

Turning now to FIG. 8, illustrated is a cross-sectional view of an embodiment of a partially completed semiconductor device including N-type implant 427 and P-type implant 432 to form channel extensions ("CE") for the P-LDMOS and N-LDMOS devices, constructed in accordance with one or more aspects of the present invention. For a laterally constructed device such as a power device, drain current generally flows along the surface of a drift region of the device, thereby creating an electric field in the same direction as the drift current. The channel extension performs a blocking function that operates on the electric field in this region to reduce the curvature of the associated electric potential, thereby delaying the onset of breakdown. At breakdown, the electric field that is associated with the channel extension is more uniform than the electric field that would be produced without the channel extension. The channel extension can be inserted into the process flow in a well-controlled manner so that a reasonable tradeoff can be achieved between a breakdown voltage, on-resistance, and hot carrier injection ("HCI"). Hot carrier injection is an undesirable effect in high-voltage lateral devices that can significantly degrade device performance and long-term quality, particularly for higher drain voltages. By careful selection of the various parameters that define the channel extension, the hot carrier injection effects can be managed.

The N-type implant 427 that forms the channel extension is formed of the same doping type or like type as the N-type well 425 in which it is deposited, and may be doped with the same or with a different atomic specie and with a doping concentration profile, preferably about $1.2 \cdot 10^{18}$ atoms/cm$^3$. Similarly, the P-type implant 432 is formed as a channel extension of the same doping type or like type as the P-type well 430 in which it is deposited, but it too may be formed with the same or with a different atomic specie and with a doping concentration profile, preferably about $1.2 \cdot 10^{18}$ atoms/cm$^3$. Additional exemplary dimensions and depth of the implants 427, 432 will be described further below. The implants 427, 432 are preferably formed with an ion implantation process including masking and patterning steps employing techniques well understood in the art to define lateral physical dimensions thereof.

Figure 9:
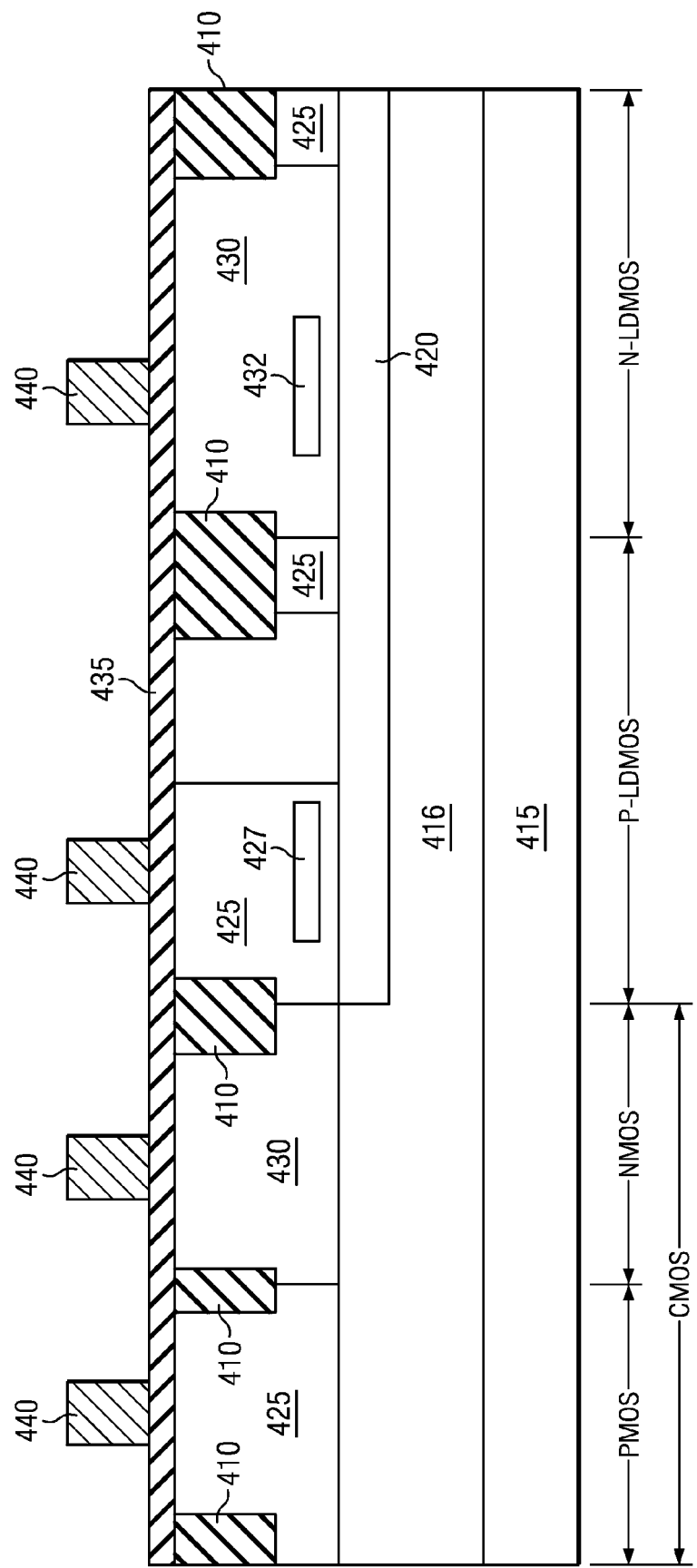

Turning now to FIG. 9, illustrated is a cross-sectional view of an embodiment of a partially completed semiconductor device including gates 440 for the PMOS, NMOS, P-LDMOS and N-LDMOS devices constructed in accordance with one or more aspects of the present invention. The process of forming the gates 440 is preceded by forming gate dielectric layer 435 over the semiconductor device of a thickness consistent with the intended operating voltage of the gates 440. The dielectric material is typically silicon dioxide with a thickness of about five nanometers for devices employing about 0.25-micrometer feature sizes and operating at low gate voltages (e.g., 2.5 volts). Assuming the gate-to-source voltage limit of the P-LDMOS and N-LDMOS devices is limited to a lower voltage (e.g., 2.5 volts) and the PMOS and NMOS devices operate at the same voltage, then the gate dielectric layer 435 can be formed with dimensions as set forth above. Preferably, the gate dielectric layer 435 is constructed with a uniform thickness to provide a gate-to-source voltage rating for the devices of approximately 2.5 volts that completely or nearly completely saturates the forward conduction properties of the device. Of course, the aforementioned voltage range for the devices is provided for illustrative purposes only and other voltage ranges are within the broad scope of the present invention.

Next, a polysilicon layer is deposited over a surface of the gate dielectric layer 435 and doped N-type or P-type, using an appropriate doping specie. The polysilicon layer is annealed at an elevated temperature to properly diffuse the dopant. A photoresist mask is employed with an etch to define the lateral dimensions to define the gates 440. The steps of depositing the dielectric and polysilicon layers, doping, annealing, and patterning are well known in the art and will not hereinafter be described in further detail. Alternatively, the gates 440 may include a wide range of materials including various metals, doped semiconductors, or other conductive materials. Additionally, the gates 440 may have a wide range of thicknesses. The thickness of the gates 440 may range from about 100 to about 500 nanometers, but may be even smaller or larger depending on the application.

The underlying gate dielectric layer 435 and the gates 440 are formed using conventional processes and will not hereinafter be described in further detail. The conventional processes include, but are not limited to, thermal oxidation, chemical vapor deposition, physical vapor deposition, epitaxial growth, or other similar process. It is recognized that the gate dielectric layer 435 and gates 440 may have different thicknesses in different areas of the substrate 415 without departing from the scope of the present invention.

Figure 10:
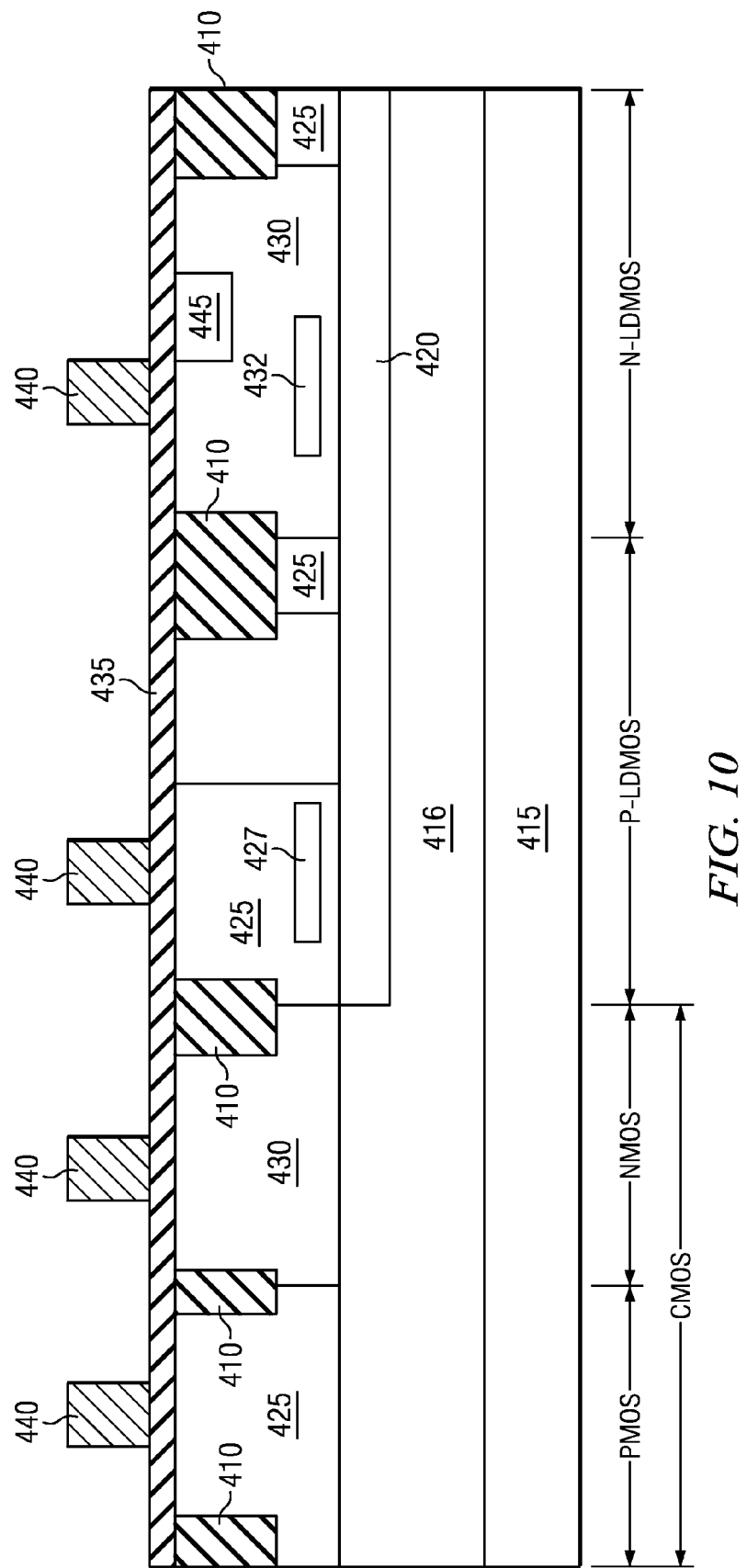

Turning now to FIG. 10, illustrated is a cross-sectional view of an embodiment of a partially completed semiconductor device including a lightly doped region (e.g., a N-type lightly doped region) 445 of a drain (also referred to as a "N-type lightly doped drain region") for the N-LDMOS device constructed in accordance with one or more aspects of the present invention. The N-type lightly doped drain region 445 allows the N-LDMOS device to accommodate higher voltage operation from the drain to the source thereof. The N-type lightly doped drain region 445 may be formed employing an ion implantation process in connection with a photoresist mask to define the lateral dimensions thereof. Additionally, an annealing process at elevated temperatures distributes the implanted ion specie. The N-type lightly doped drain region 445 is preferably doped, without limitation, to about $1 \cdot 10^{16}$ to $1 \cdot 10^{17}$ atoms/cm$^3$. The steps of patterning, ion implanting and annealing are well known in the art and will not hereinafter be described in further detail.

Figure 11:
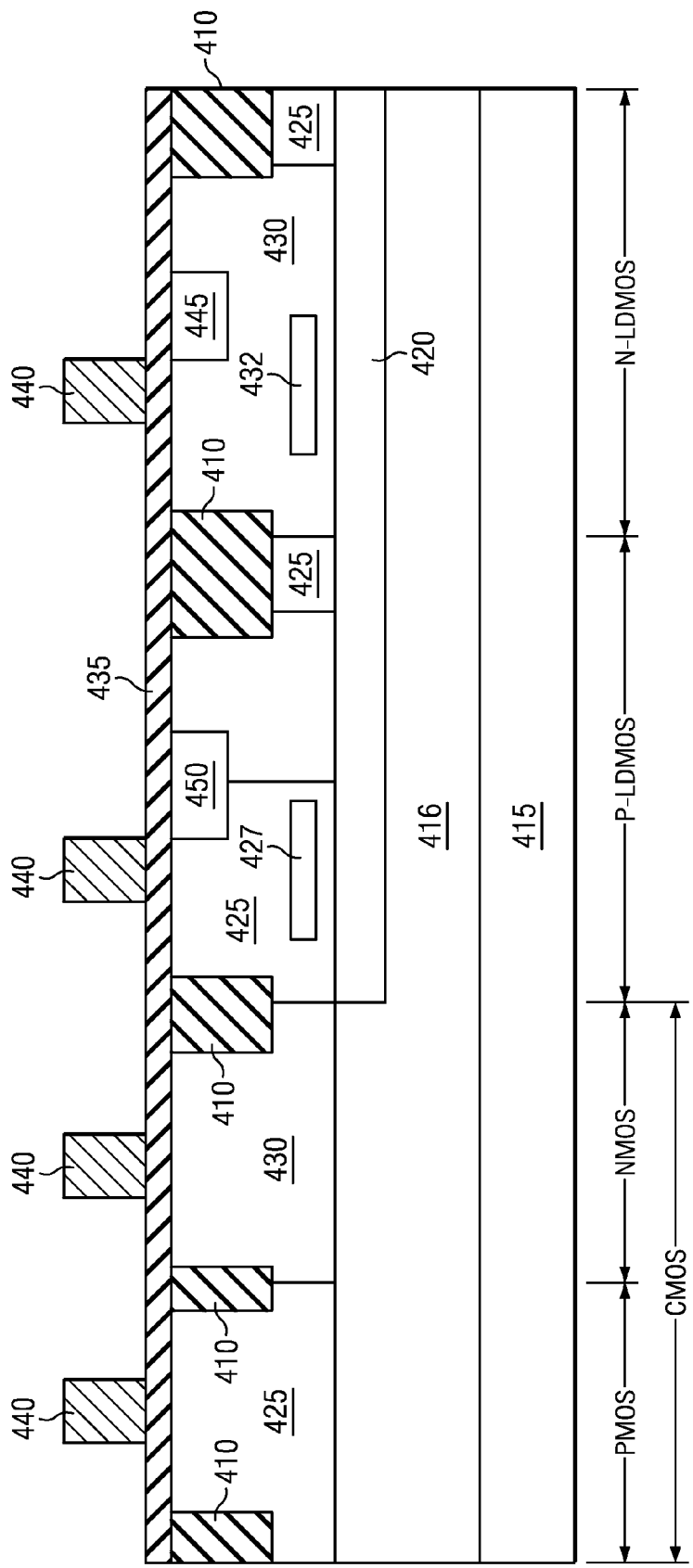

Turning now to FIG. 11, illustrated is a cross-sectional view of an embodiment of a partially completed semiconductor device including a lightly doped region (e.g., a P-type lightly doped region) 450 of a drain (also referred to as a "P-type lightly doped drain region") for the P-LDMOS device constructed in accordance with one or more aspects of the present invention. The P-type lightly doped drain region 450 allows the P-LDMOS device to accommodate higher voltage operation from the drain to the source thereof. The P-type lightly doped drain region 450 may be formed employing an ion implantation process in connection with a photoresist mask to define the lateral dimensions thereof. Additionally, an annealing process at elevated temperatures distributes the implanted ion specie. The P-type lightly doped drain region 450 is preferably doped, without limitation, to about $1 \cdot 10^{16}$ to $1 \cdot 10^{17}$ atoms/cm$^3$. The steps of patterning, ion implanting and annealing are well known in the art and will not hereinafter be described in further detail.

The N-type and P-type lightly doped drain regions 445, 450 provide higher voltage drains for the N-LDMOS and P-LDMOS devices, respectively. In effect, the N-type and P-type lightly doped drain regions 445, 450 form parasitic diodes with adjoining oppositely doped wells, namely, the P-type well 430 and N-type well 425, respectively. The breakdown voltage of the parasitic diodes is determined by the doping concentration profiles, with lighter doping concentration profiles providing a higher breakdown voltage because the resulting internal electric fields are distributed over longer distances when the diodes are back biased. It is recognized that the width of the N-type and P-type lightly doped drain regions 445, 450 may be individually varied to alter the breakdown voltage characteristics of the respective N-LDMOS and P-LDMOS devices without departing from the scope of the present invention.

Figure 12:
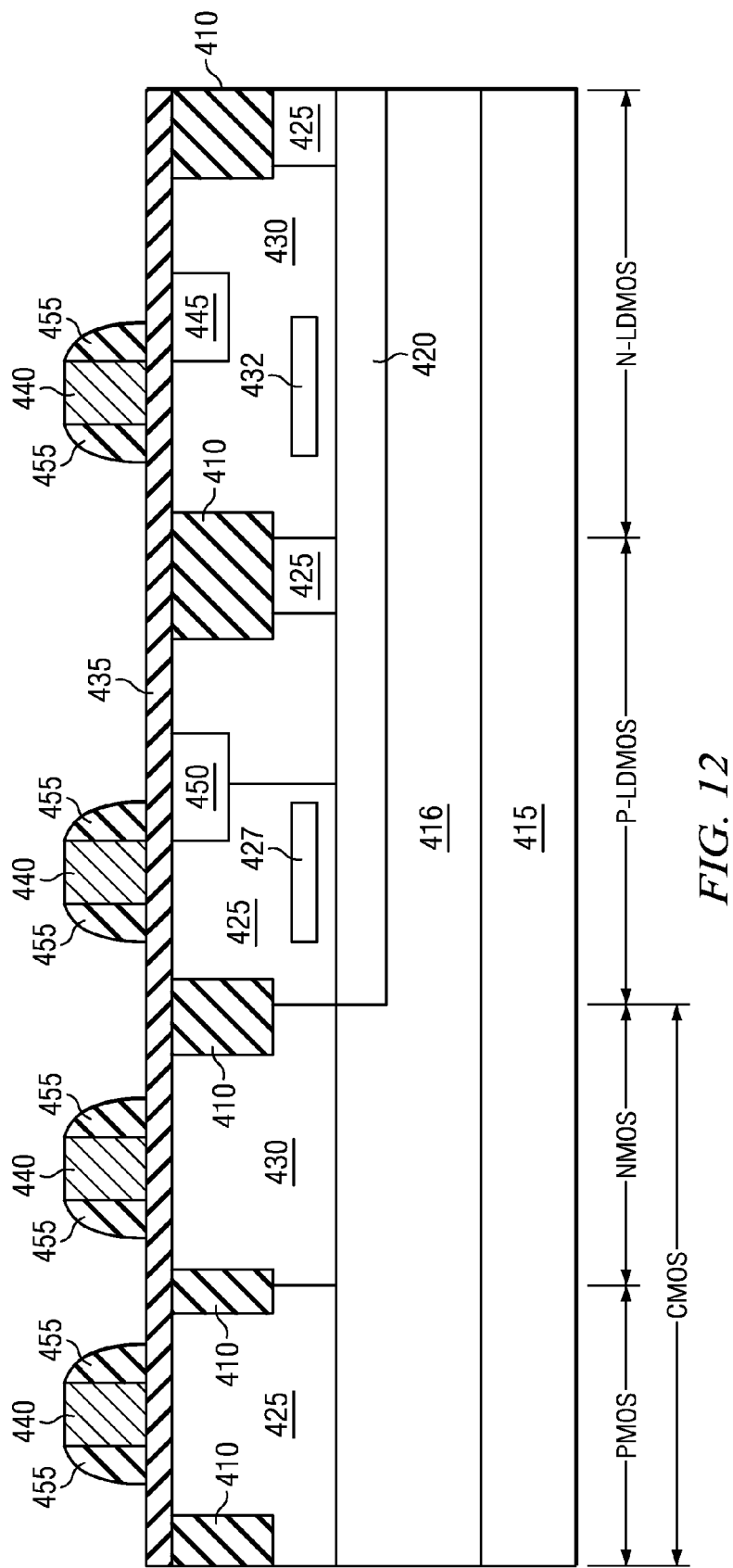

Turning now to FIG. 12, illustrated is a cross-sectional view of an embodiment of a partially completed semiconductor device including gate sidewall spacers 455 about the gates 440 constructed in accordance with one or more aspects of the present invention. The gate sidewall spacers 455, which may be formed from an oxide or other dielectric material, are generally formed by depositing a nitride followed by an etching process. The material forming the gate sidewall spacers 455 may be the same or different from the dielectric material used for the gate dielectric layer 435.

Figure 13:
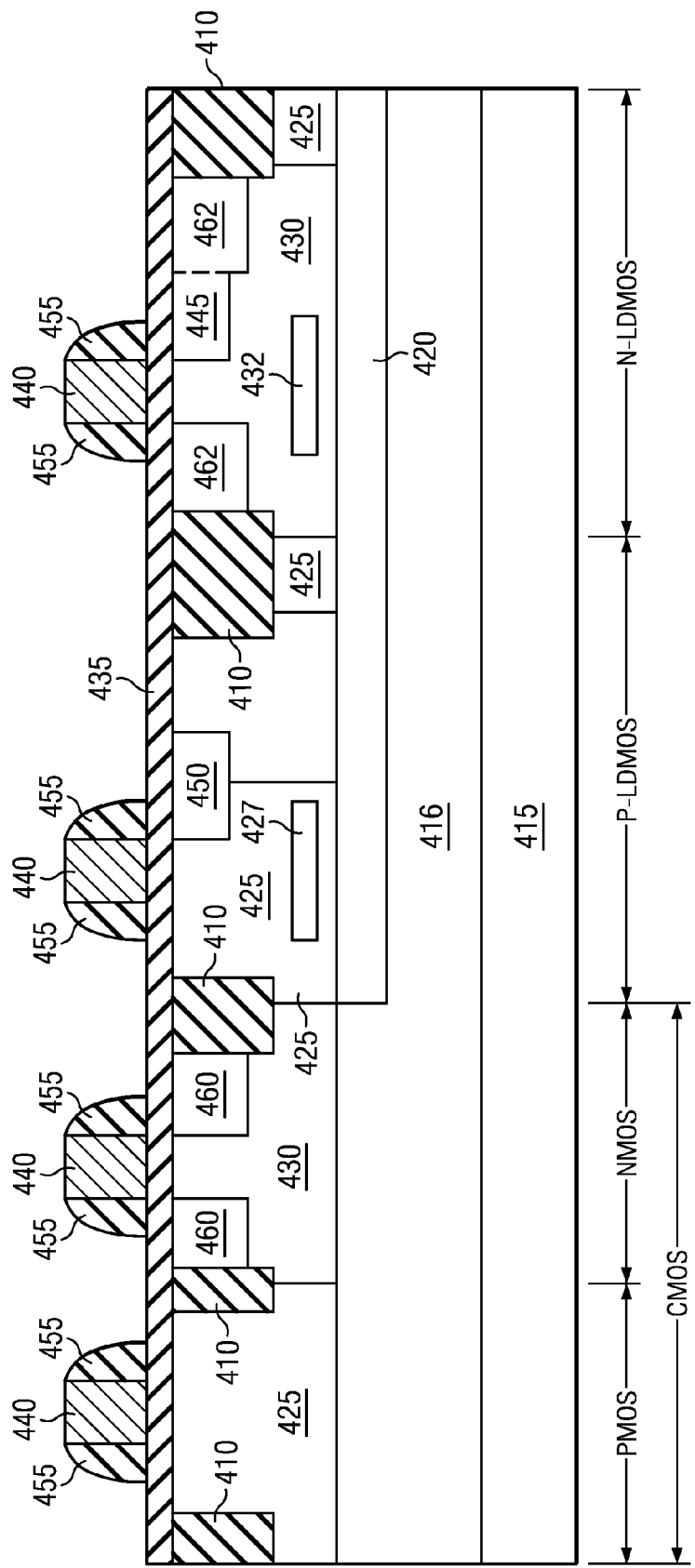

Turning now to FIG. 13, illustrated is a cross-sectional view of an embodiment of a partially completed semiconductor device including heavily doped regions for the source and drain (often referred to individually as a "source/drain" and together as a "source/drain and another source/drain," and vice-versa) of the NMOS and N-LDMOS devices constructed in accordance with one or more aspects of the present invention. The heavily doped regions (e.g., N-type heavily doped regions) 460 for the source and drain of the NMOS device preferably have a different doping concentration profile than the heavily doped regions (e.g., N-type heavily doped regions) 462 for the source and drain of the N-LDMOS device. The N-type heavily doped regions 460 for the NMOS device are formed within the P-type well 430 thereof and, as alluded to above, form the source and the drain for the NMOS device. Additionally, the N-type heavily doped regions 462 for the N-LDMOS device are formed within the P-type well 430 thereof and, as alluded to above, form the source and a portion of the drain for the N-LDMOS device. Also, the N-type heavily doped region 462 of the drain for the N-LDMOS device is adjacent the N-type lightly doped drain region 445 thereof.

The N-type heavily doped regions 460, 462 may be advantageously formed with an ion implantation process using a dopant specie such as arsenic or phosphorus. The doping process includes a photoresist mask to define lateral dimensions of the N-type heavily doped regions 460, 462 and an annealing process at elevated temperature to properly distribute the implanted specie. The N-type heavily doped region 460 for the source and drain of the NMOS device is doped, without limitation, to be greater than about $1\cdot10^{19}$ atoms/cm$^3$. The N-type heavily doped region 462 for the source and drain of the N-LDMOS device is doped, without limitation, to be greater than about $5\cdot10^{19}$ atoms/cm$^3$. Incorporating the different doping concentration profiles of the N-type heavily doped regions 460, 462 for the source and drain of the NMOS and N-LDMOS devices typically adds additional processing steps to the design thereof. It should be understood, however, that the N-type heavily doped regions 460, 462 for the source and drain of the NMOS and N-LDMOS devices may incorporate the same or analogous doping concentration profiles and still be within the broad scope of the present invention. Inasmuch as the steps of patterning, ion implanting and annealing are well known in the art, the processes will not hereafter be described in further detail.

Figure 14:
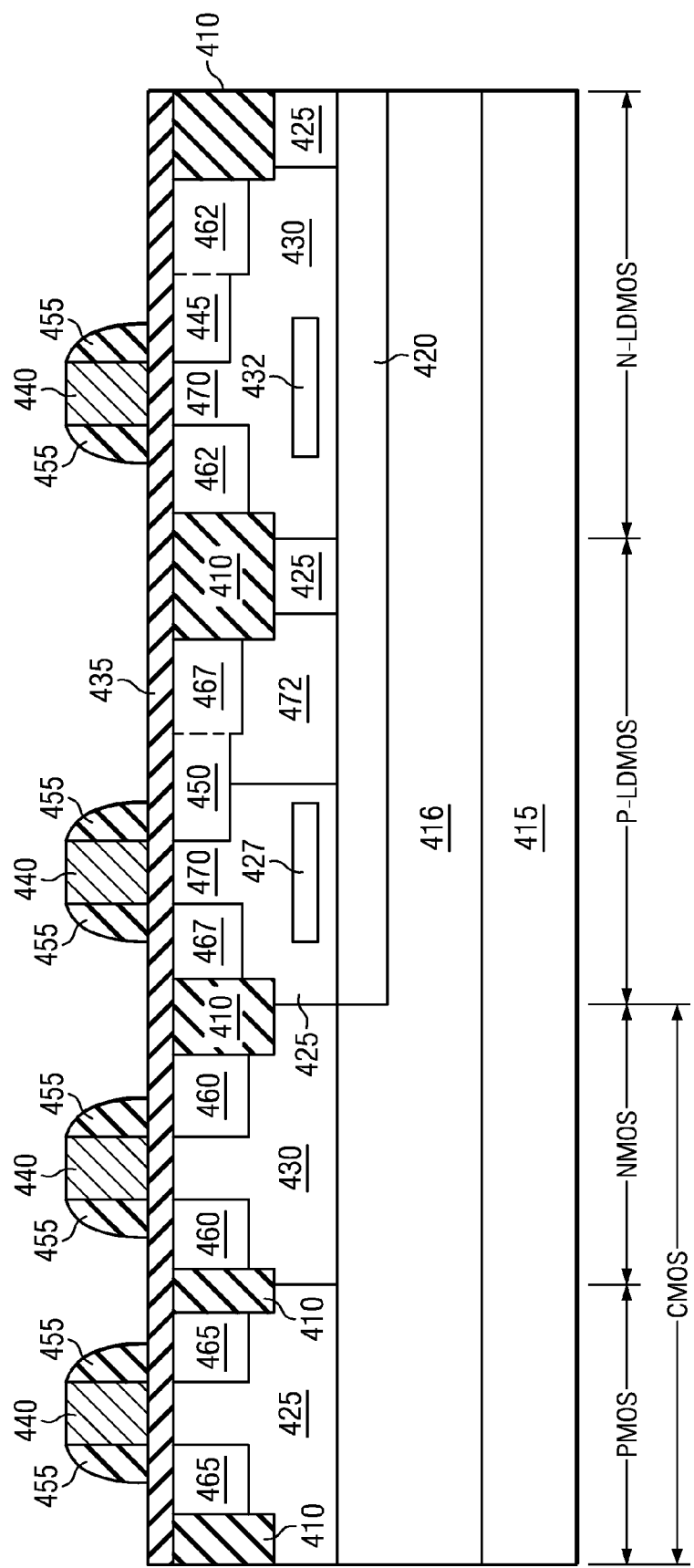

Turning now to FIG. 14, illustrated is a cross-sectional view of an embodiment of a partially completed semiconductor device including heavily doped regions for the source and drain for the PMOS and P-LDMOS devices constructed in accordance with one or more aspects of the present invention. The heavily doped regions (e.g., P-type heavily doped regions) 465 for the source and drain of the PMOS device preferably have a different doping concentration profile than the heavily doped regions (e.g., P-type heavily doped regions) 467 for the source and drain of the P-LDMOS device. The P-type heavily doped regions 465 for the PMOS device are formed within the N-type well 425 thereof and, as alluded to above, form the source and the drain for the PMOS device. Additionally, the P-type heavily doped regions 467 for the P-LDMOS device are formed within the N-type well 425 or in a region adjacent the N-type well 425 thereof and, as alluded to above, form the source and a portion of the drain for the P-LDMOS device. Also, the P-type heavily doped region 467 of the drain for the P-LDMOS device is adjacent the P-type lightly doped drain region 450 thereof.

The P-type heavily doped regions 465, 467 may be advantageously formed with an ion implantation process using dopant specie such as boron. The doping process includes a photoresist mask to define lateral dimensions of the P-type heavily doped regions 465, 467 and an annealing process at elevated temperature to properly distribute the implanted specie. The P-type heavily doped region 465 for the source and drain of the PMOS device is doped, without limitation, to be greater than about $1\cdot10^{19}$ atoms/cm$^3$. The P-type heavily doped region 467 for the source and drain of the P-LDMOS device is doped, without limitation, to be greater than about $5\cdot10^{19}$ atoms/cm$^3$. Incorporating the different doping concentration profiles of the P-type heavily doped regions 465, 467 for the source and drain of the PMOS and P-LDMOS devices typically adds additional processing steps to the design thereof. It should be understood, however, that the P-type heavily doped regions 465, 467 for the source and drain of the PMOS and P-LDMOS devices may incorporate the same or analogous doping concentration profiles and still be within the broad scope of the present invention. Inasmuch as the steps of patterning, ion implanting and annealing are well known in the art, the processes will not hereafter be described in further detail.

The annealing process described above with respect to FIG. 14 inherently anneals the previously doped regions of the semiconductor device as well. As is well understood in the art, the cumulative time-temperature function for the annealing processing steps is a factor in integrated circuit design to provide proper "drive-in" of the implanted specie. The time period, temperature range and selected steps to perform the annealing processes may vary depending on an application and the desired results to form a semiconductor device incorporated into an integrated circuit. Thus, it is contemplated that the annealing processes may be performed after each ion implantation process as described herein or delayed until after several ion implantation processes and still achieve the desired results.

As mentioned above, the N-type well 425 above the N-type buried layer 420 does not cover the entire area that accommodates the P-LDMOS device in the epitaxial layer 416 of the substrate 415 between the shallow trench isolation regions 410 thereof. In particular, the N-type well 425 covers about half of the area that accommodates the P-LDMOS device through a channel region (some of which is designated 470) that is adjacent to and extends between the P-type heavily doped region 467 of source and the P-type lightly doped drain region 450 of the drain, and under the gate 440 thereof recessed into the substrate 415 (or the overlying epitaxial layer 416). In other words, the N-type well 425 extends under and within the channel region 470, and the N-type well 425 and N-type buried layer 420 are oppositely doped in comparison to the P-type lightly doped drain region 450 and P-type heavily doped region 467. For purposes of clarity, the channel region 470 is generally defined and well understood to be a conductive region between the source and drain (or the lightly or heavily doped regions thereof) of a transistor that is induced under the gate by a charge thereon. Thus, a doped region (e.g., a P-type doped region) 472 extends between the P-type heavily doped region 467 and the N-type well 425 of the P-LDMOS device (under a portion of the P-type lightly doped drain region 450) and has a doping concentration profile less than a doping concentration profile of the P-type heavily doped region 467.

In the illustrated embodiment, the P-type doped region 472 happens to be embodied in the epitaxial layer 416, which has a doping concentration profile between $1\cdot10^{14}$ and $1\cdot10^{16}$ atoms/cm$^3$. Employing the epitaxial layer 416 as the P-type doped region 472 provides an opportunity to omit a masking and a processing step in the manufacture of the semiconductor device. Of course, the epitaxial layer 416 may be omitted and the P-type doped region 472 may be formed in the substrate 415 (in this case, a P-type doped substrate). In yet another alternative embodiment, the P-type doped region 472 may be formed by an ion implantation process prior to implanting the P-type heavily doped region 467 for the drain of the P-LDMOS device. In such a case, the P-type doping material such as boron would be implanted to provide a doping concentration profile less than a doping concentration profile of the P-type heavily doped region 467. Of course, the P-type doped region 472 may be formed with any doping concentration profile less than the P-type heavily doped region 467 including a doping concentration profile less than the P-type lightly doped drain region 450 and still be within the broad scope of the present invention.

Incorporating the P-type doped region 472 into the P-LDMOS device increases a breakdown voltage between the P-type heavily doped region 467 and the N-type well 425 of the P-LDMOS device. More specifically, in effect the P-type doped region 472 forms a parasitic diode with the adjoining oppositely doped N-type well 425. The breakdown voltage of the parasitic diode is determined by the doping concentration profiles, with lighter doping concentration profiles providing a higher breakdown voltage because the resulting internal electric fields are distributed over longer distances when the diodes are back biased. Thus, the P-LDMOS device exhibits a higher drain-to-source voltage handling capability due to the higher breakdown voltage thereof. Thus, the P-LDMOS device can handle voltages, without limitation, of at least ten volts while constructed on the same substrate 415 as the CMOS devices, namely, the PMOS and NMOS devices that operate at lower voltages (e.g., 2.5 volts). It should be understood that while the doped region has been described with respect to the P-LDMOS device, the principles are equally applicable to the N-LDMOS device and, for that matter, other transistors of analogous construction.

Figure 15:
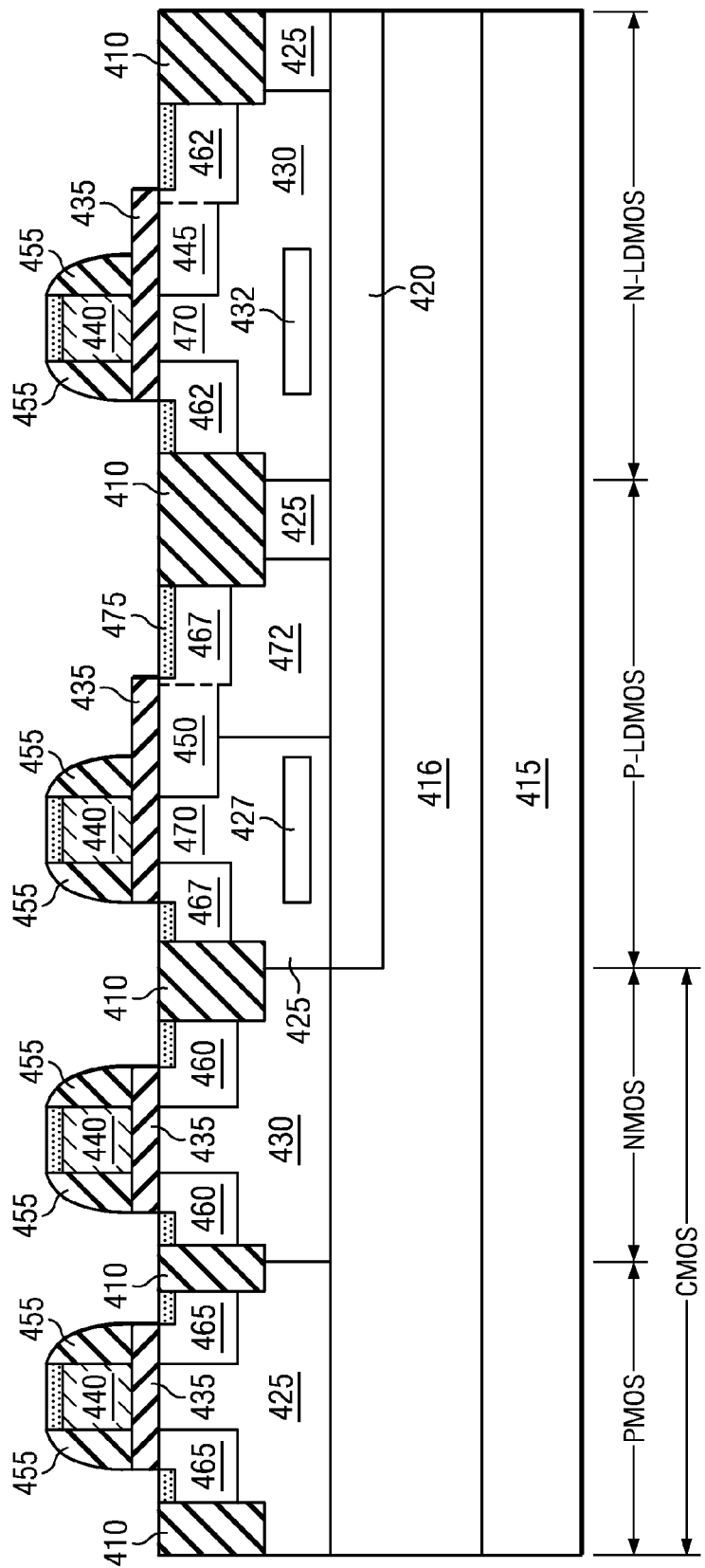

Turning now to FIG. 15, illustrated is a cross-sectional view of an embodiment of a partially completed semiconductor device including a salicide layer (one of which is designated 475) on the gate, source and drain of the NMOS, PMOS, N-LDMOS and P-LDMOS devices constructed in accordance with one or more aspects of the present invention. As clearly understood by those skilled in the art, the formation of the salicide layer 475 refers to deposition of a metal over silicon by a sputtering or other deposition process followed by an annealing process to improve a conductivity of polysilicon or other material and to facilitate the formation of ohmic contacts.

First, a region for salicidation is exposed using a photoresist mask to selectively etch the gate dielectric layer 435 from the source and drain of the NMOS, PMOS, N-LDMOS and P-LDMOS devices. Then, a metal, generally titanium, is deposited and the substrate 415 is annealed at an elevated temperature. During the annealing process, metal in contact with silicon reacts with silicon to form the salicide layer 475. The metal not in contact with silicon remains as metal, which can be etched away, leaving behind the salicide layer 475. The steps of masking, depositing metal, annealing and etching are well known in the art and will not hereinafter be described in further detail.

Figure 16:
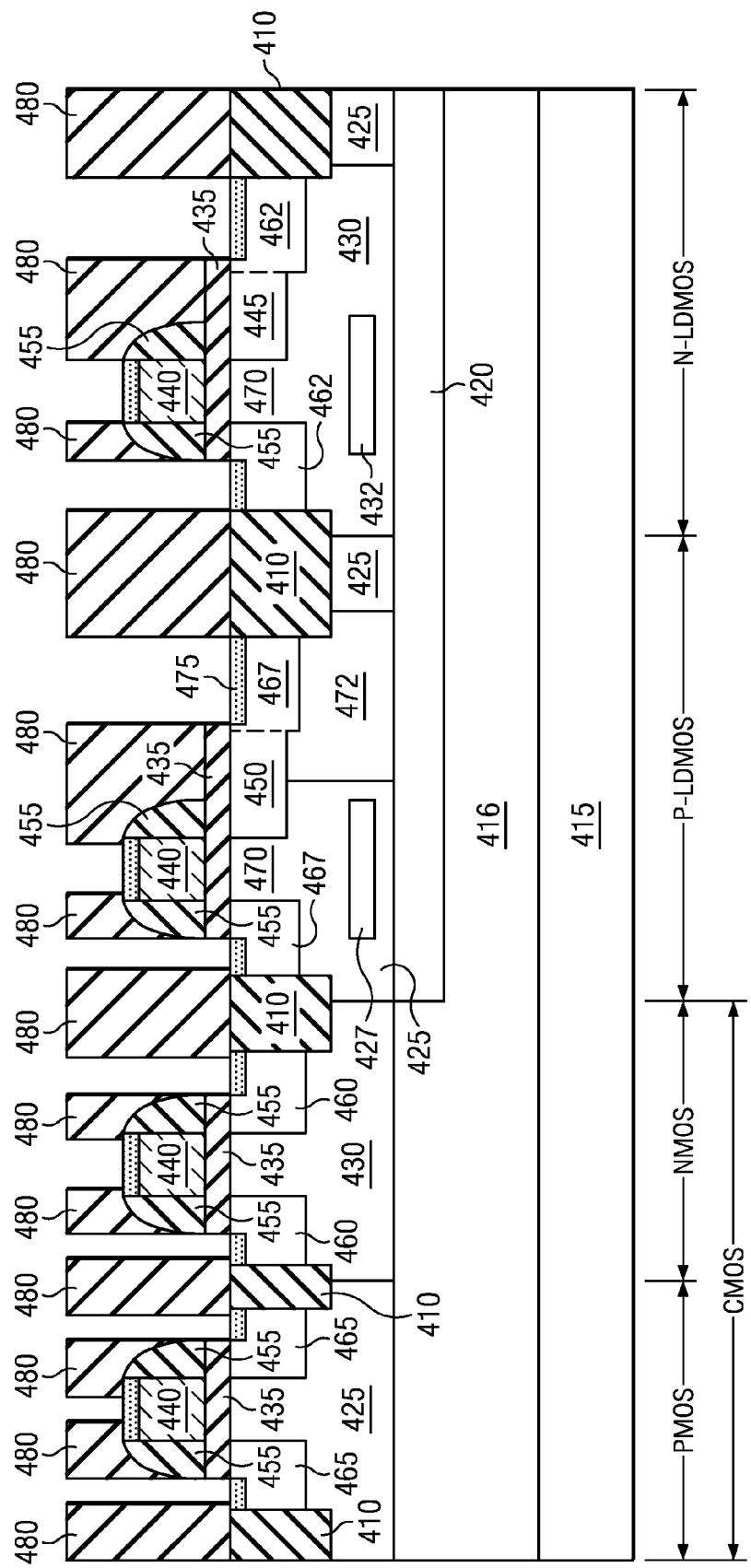

Turning now to FIG. 16, illustrated is a cross-sectional view of an embodiment of a partially completed semiconductor device including dielectric regions 480 for defining metal contacts constructed in accordance with one or more aspects of the present invention. The semiconductor device is illustrated following a masking, deposition and etching of a dielectric layer to define the dielectric regions 480. The dielectric regions 480 may be formed from an oxide or other suitable dielectric material. The dielectric regions 480 are generally formed by blanket depositing the dielectric layer over the surface of the partially completed semiconductor device and anisotropically etching the dielectric layer, resulting in the dielectric regions 480. The steps of depositing the dielectric layer, masking and etching are well known in the art and will not hereinafter be described in further detail.

Figure 17:
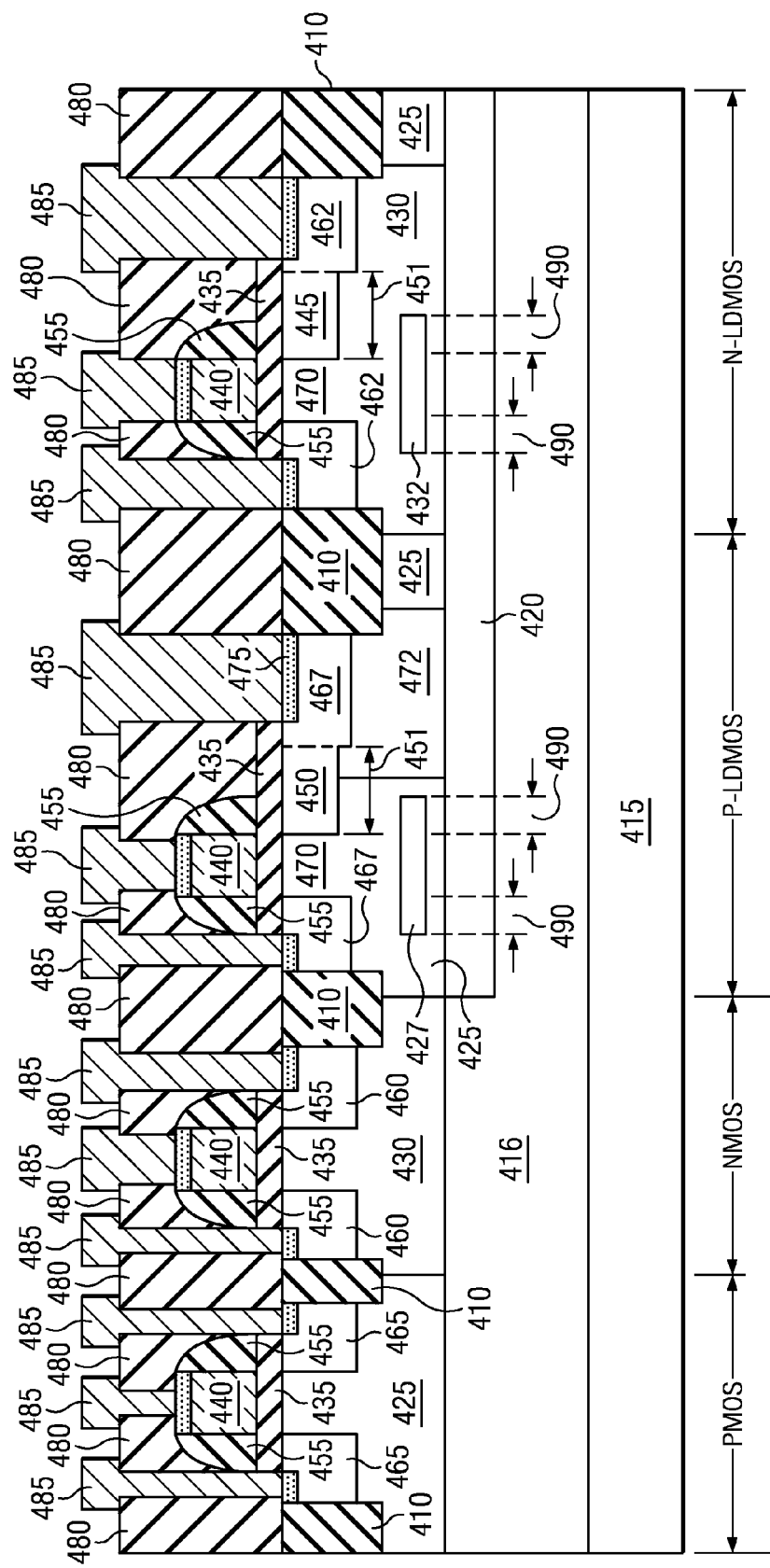

Turning now to FIG. 17, illustrated is a cross-sectional view of the semiconductor device including metal (ohmic) contacts 485 formed over the salicide layer 475 on the gate, source and drain of the NMOS, PMOS, N-LDMOS and P-LDMOS devices constructed in accordance with one or more aspects of the present invention. The embodiment illustrates the semiconductor device following deposition and patterning of a metal (e.g., aluminum) for the metal contacts 485. The masking, etching, and further deposition of the dielectric and metal layers may be repeated several times to provide multiple, highly conductive layers and interconnections in accordance with the parameters of the application. For example, a four-level metal interconnection arrangement may be provided by incorporating several steps to form the multi-level metal contacts 485. As illustrated, the metal contacts 485 are formed about and defined by the dielectric layers 480.

As illustrated in FIG. 17, the N-type implant 427 and the P-type implant 432 that form the channel extensions are positioned under the channel regions 470 of the P-LDMOS and the N-LDMOS, respectively. The N-type implant 427 extends under a portion of the P-type lightly doped drain region 450 and the P-type heavily doped region 467 for the P-LDMOS by channel extension lengths (generally designated 490). The P-type implant 432 extends under a portion of the N-type lightly doped drain region 445 and the N-type heavily doped region 462 for the N-LDMOS by channel extension lengths (generally designated 490). In general, the implants extend a short but limited distance beyond the respective gate/channel region, terminating under the respective lightly and heavily doped regions. The channel extension lengths 490 are advantageously selected as described further hereinbelow to provide increased breakdown voltage for the device and to reduce on-state resistance. The channel extension lengths 490 may be the same or unequal with respect to the P-LDMOS and N-LDMOS, and also with respect to the lightly and heavily doped regions of a LDMOS. Exemplary parameters for the design of a channel extension and the respective lightly doped drain region for various semiconductor geometries include channel extension lengths of 0.3 µm (both lengths equal), channel extension dose of $1 \cdot 10^{13}$ cm$^{-2}$, channel extension energy of 160 kilovolts ("kV"), length (designated 451) of lightly doped drain region of 0.6 µm, and lightly doped drain dose of $5 \cdot 10^{12}$ cm$^{-2}$.

TABLE I below illustrates the effect on device breakdown voltage, on-state resistance, saturation current, and threshold voltage due to varying the lightly doped drain region (or "lightly doped drain") dose for a fixed channel extension length, channel extension dose, and channel extension energy. Substantial effects on breakdown voltage, on-state resistance, and saturation current can be observed in the data. As can be seen in TABLE I below, the effect of varying the lightly doped drain dose on threshold voltage is not substantial.

TABLE I

Impact of Varying the Lightly Doped Drain Dose

| channel extension length [μm] | channel extension dose [cm$^{-2}$] | channel extension energy [kV] | lightly doped drain length [μm] | lightly doped drain dose [cm$^{-2}$] | break- down voltage [V] | on-state resistance [ohm ("Ω") · cm$^2$] | saturation current [microamperes ("μA") · cm$^{-2}$] | threshold voltage [V] |
|---|---|---|---|---|---|---|---|---|
| 0.25 | $1 \cdot 10^{13}$ | 200 | 0.6 | $7 \cdot 10^{12}$ | 13.7 | 416 | 236 | 0.6 |
| 0.25 | $1 \cdot 10^{13}$ | 200 | 0.6 | $5 \cdot 10^{12}$ | >19 | 555 | 196 | 0.6 |
| 0.25 | $1 \cdot 10^{13}$ | 200 | 0.6 | $3.5 \cdot 10^{12}$ | >19 | 806 | 161 | 0.6 |

TABLE II below illustrates the effect on device breakdown voltage, on-state resistance, saturation current, and threshold voltage due to varying the channel extension energy (i.e., its depth) for a fixed channel extension length, channel extension dose, length of the lightly doped drain, and lightly doped drain dose. Substantial effects on saturation current can be observed in the data. As can be seen in TABLE II below, the effect of varying the lightly doped drain dose on breakdown voltage, on-state resistance, and threshold voltage are less significant.

TABLE II

Impact of Varying the Channel Extension Energy

| channel extension length [μm] | channel extension dose [cm$^{-2}$] | channel extension energy [kV] | lightly doped drain length [μm] | lightly doped drain dose [cm$^{-2}$] | break- down voltage [V] | on-state resistance [Ω · cm$^2$] | saturation current [μA · cm$^{-2}$] | threshold voltage [V] |
|---|---|---|---|---|---|---|---|---|
| 0.25 | $1 \cdot 10^{13}$ | 200 | 0.6 | $5 \cdot 10^{12}$ | >19 | 555 | 196 | 0.6 |
| 0.25 | $1 \cdot 10^{13}$ | 160 | 0.6 | $5 \cdot 10^{12}$ | >19 | 555 | 189 | 0.6 |
| 0.25 | $1 \cdot 10^{13}$ | 120 | 0.6 | $5 \cdot 10^{12}$ | 18.1 | 564 | 177 | 0.61 |

TABLE III below illustrates the effect on device breakdown voltage, on-state resistance, saturation current, and threshold voltage due to varying the channel extension length for a fixed channel extension dose, channel extension energy, length of the lightly doped drain, and lightly doped drain dose. Modest or insubstantial effects on breakdown voltage, on-state resistance, saturation current, and threshold voltage can be observed in the data.

TABLE III

Impact of Varying the Channel Extension Length

| channel extension length [μm] | channel extension dose [cm$^{-2}$] | channel extension energy [kV] | lightly doped drain length [μm] | lightly doped drain dose [cm$^{-2}$] | break- down voltage [V] | on-state resistance [Ω · cm$^2$] | saturation current [μA · cm$^{-2}$] | threshold voltage [V] |
|---|---|---|---|---|---|---|---|---|
| 0.15 | $1 \cdot 10^{13}$ | 160 | 0.6 | $5 \cdot 10^{12}$ | >19 | 555 | 191 | 0.6 |
| 0.25 | $1 \cdot 10^{13}$ | 160 | 0.6 | $5 \cdot 10^{12}$ | >19 | 555 | 196 | 0.6 |
| 0.35 | $1 \cdot 10^{13}$ | 160 | 0.6 | $5 \cdot 10^{12}$ | 17.7 | 570 | 187 | 0.6 |

Figure 18:
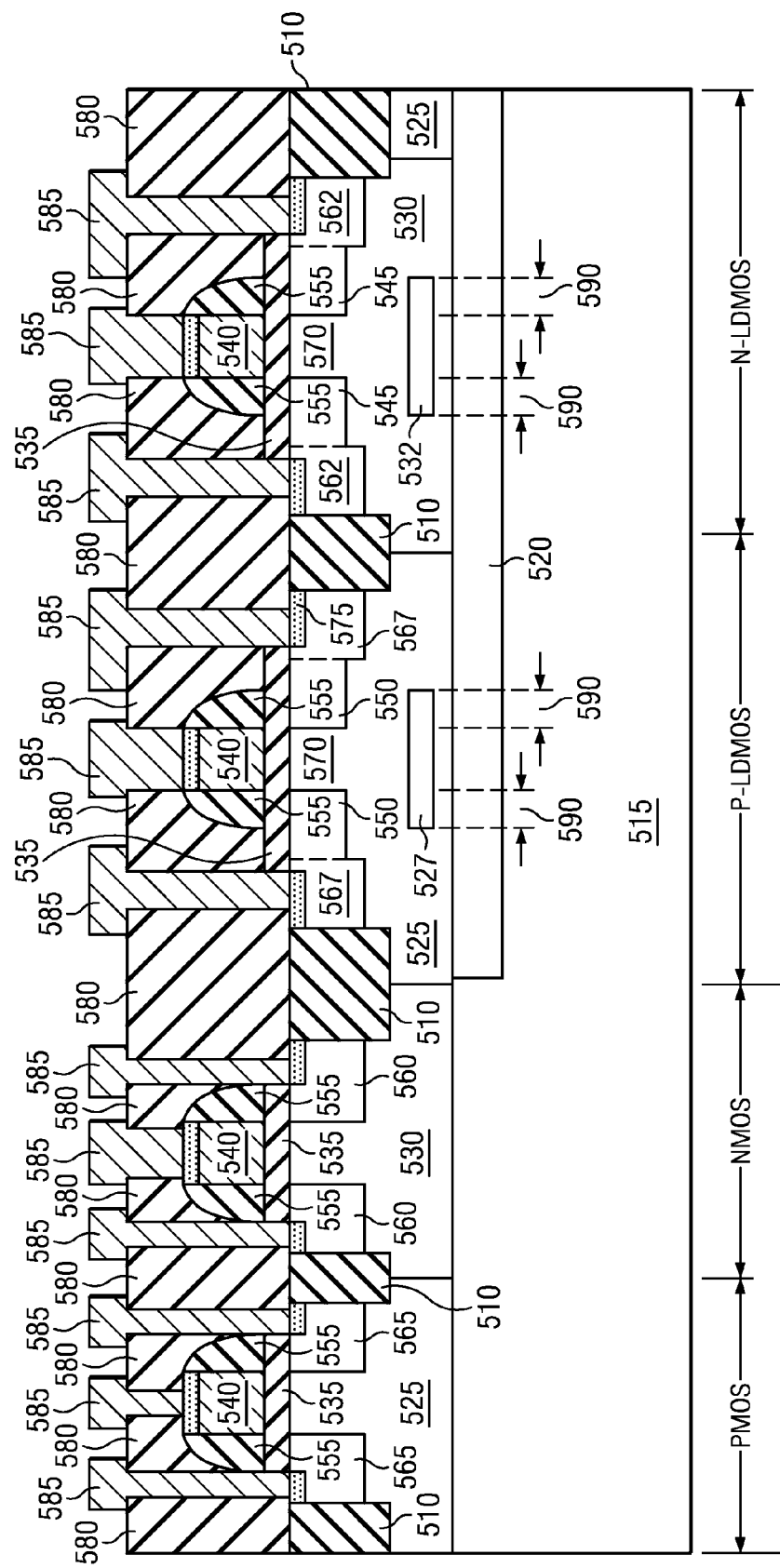
FIG. 18 illustrates a cross-sectional view of another embodiment of a semiconductor device embodied in, or portions thereof, an integrated circuit constructed according to the principles of the present invention.

Turning now to FIG. 18, illustrated is a cross-sectional view of another embodiment of a semiconductor device embodied in, or portions thereof, an integrated circuit constructed according to the principles of the present invention. Inasmuch as the processing steps to construct the semiconductor device of FIG. 18 are analogous to the processing steps described above, the steps in the process will not hereinafter be described in detail. The semiconductor device includes isolation regions (e.g., shallow trench isolation regions) 510 within a substrate 515 (e.g., P-type substrate) to provide dielectric separation between PMOS, NMOS, P-LDMOS and N-LDMOS devices. A buried layer (e.g., an N-type buried layer, also generally referred to as an "oppositely doped buried layer") 520 is recessed within the substrate 515 in the area that accommodates the P-LDMOS device and the N-LDMOS device.

The semiconductor device also includes wells (e.g., N-type wells, generally referred to as an "oppositely doped buried layer") 525 formed in the substrate 515 in the areas that accommodate the PMOS device and the P-LDMOS device, and under the shallow trench isolation regions 510 above the N-type buried layer 520 (for the P-LDMOS). The N-type wells 525 are formed to provide electrical isolation for the PMOS device and the P-LDMOS device and operate cooperatively with the N-type buried layer 520 (in the case of the P-LDMOS device) and the shallow trench isolation regions 510 to provide the isolation.

The semiconductor device includes additional wells (e.g., P-type wells, generally referred to as an "oppositely doped buried layer") 530 formed in the substrate 515 between the shallow trench isolation regions 510 substantially in the areas that accommodate the NMOS device and N-LDMOS device. While the P-type well 530 above the N-type buried layer 520 covers the entire area that accommodates the N-LDMOS device in the substrate 515 between the shallow trench isolation regions 510 thereof, it is well within the broad scope of the present invention to define the P-type well 530 to cover only a portion of the area that accommodates the N-LDMOS device in the substrate 515. The semiconductor device also includes gates 540 for the PMOS, NMOS, P-LDMOS and N-LDMOS devices located over a gate dielectric layer 535 and including gate sidewall spacers 555 about the gates 540 thereof.

The N-LDMOS device includes lightly doped regions (e.g., N-type lightly doped regions) 545 for the source and the drain thereof. The P-LDMOS device also includes lightly doped regions (e.g., P-type lightly doped regions) 550 for the source and the drain thereof. In the present embodiment and for analogous reasons as stated above, the N-type and P-type lightly doped regions 545, 550 provide higher voltage sources and drains for the N-LDMOS and P-LDMOS devices, respectively. As a result, not only can the N-LDMOS and P-LDMOS devices handle higher voltages from the drain-to-source thereof, but the devices can handle a higher voltage from a source-to-gate thereof when the source is more positive than the gate 540. It is recognized that the width of the N-type and P-type lightly doped regions 545, 550 may be individually varied to alter the breakdown voltage characteristics of the respective N-LDMOS and P-LDMOS devices without departing from the scope of the present invention. Additionally, the N-type and P-type lightly doped regions 545, 550 may be formed in a manner similar to the respective N-LDMOS and P-LDMOS devices illustrated and described with respect to FIGS. 4 through 17.

The semiconductor device also includes heavily doped regions (e.g., N-type heavily doped regions) 560 for the source and drain of the NMOS device that preferably have a different doping concentration profile than heavily doped regions (e.g., N-type heavily doped regions) 562 for the source and drain of the N-LDMOS device. The N-type heavily doped regions 560 for the NMOS device are formed within the P-type well 530 thereof and, as alluded to above, form the source and the drain for the NMOS device. Additionally, the N-type heavily doped regions 562 for the N-LDMOS device are formed within the P-type well 530 thereof and, as alluded to above, form a portion of the source and the drain for the N-LDMOS device. Also, the N-type heavily doped regions 562 of the source and drain for the N-LDMOS device are adjacent the N-type lightly doped drain regions 545 thereof.

The semiconductor device also includes heavily doped regions (e.g., P-type heavily doped regions) 565 for the source and drain of the PMOS device that preferably have a different doping concentration profile than heavily doped regions (e.g., P-type heavily doped regions) 567 for the source and drain of the P-LDMOS device. The P-type heavily doped regions 565 for the PMOS device are formed within the N-type well 525 thereof and, as alluded to above, form the source and the drain for the PMOS device. Additionally, the P-type heavily doped regions 567 for the P-LDMOS device are formed within the N-type well 525 or in regions adjacent the N-type well 525 thereof and, as alluded to above, form a portion of the source and the drain for the P-LDMOS device. Also, the P-type heavily doped regions 567 of the source and drain for the P-LDMOS device are adjacent the P-type lightly doped drain regions 550 thereof.

While the P-type heavily doped regions 567 preferably have the same doping concentration profiles, it is well within the broad scope of the present invention that the P-type heavily doped region 567 for the source has a different doping concentration profile than the counterpart of the drain. The same principle applies to other like regions of the devices of the semiconductor device.

Additionally, whereas the P-LDMOS and N-LDMOS devices illustrated and described with respect to FIGS. 4 through 17 are referred to as asymmetrical devices, the P-LDMOS and N-LDMOS devices illustrated and described with respect to FIG. 18 are referred to as symmetrical devices. In other words, the symmetrical nature of the source and drain of the semiconductor device of FIG. 18 provide for a symmetrical device. Of course, those skilled in the art should understand that the dimensions of the source and drain (including the lightly and heavily doped regions thereof) may vary and still fall within the broad scope of the present invention, including deviations from symmetry. The semiconductor device also includes channel regions (some of which is designated 570), metal contacts 585 defined by dielectric regions 580 formed over salicide layers (one of which is designated 575) for the gate, source and drain of the PMOS, NMOS, P-LDMOS and N-LDMOS devices.

The semiconductor device also includes an N-type implant 527 and a P-type implant 532 to form channel extensions, and are positioned, respectively, under the channel regions 570 of the P-LDMOS and the N-LDMOS devices. The N-type and P-type implants 527, 532 are formed with channel extension lengths 590 similar to those described with reference to the semiconductor device illustrated in FIGS. 4 through 17. The implants extend a short but limited distance beyond the respective gate/channel region, terminating under the respective lightly and heavily doped regions. The channel extension lengths 590 are advantageously selected as described previously hereinabove to provide increased breakdown voltage for the device and to reduce on-state resistance. The channel extension lengths 590 may be the same or unequal. Again, the channel extensions may be of like type to and have a doping concentration profile greater than a doping concentration profile of the respective oppositely doped wells.

The development of a semiconductor device as described herein retains fine line structures and accommodates an operation at higher voltages and with higher switching frequencies (e.g., five to ten megahertz). By introducing the lightly doped region(s) between the heavily doped region and oppositely doped well, the LDMOS device exhibits a high voltage handling capability from the drain to the source thereof. The introduction of the channel extension in the oppositely doped well with a same doping polarity as the oppositely doped well and with a length extending a distance beyond the gate/channel region and terminating under a lightly doped region or heavily doped region advantageously enables construction of a device with yet a higher voltage rating that requires a smaller active area to achieve a given on-state resistance. At the same time, the higher voltage device is constructed employing a limited number of additional processing steps. Moreover, the LDMOS device may exhibit a low-level gate-to-source voltage limit (e.g., 2.5 volts) and at the same time handle drain-to-source voltages above the gate-to-source voltage limit thereof. Alternatively, the LDMOS device may exhibit a higher level source-to-gate voltage handling capability (e.g., five volts) when the source is more positive than the gate and at the same time handle drain-to-source voltages above the low level gate-to-source voltage limit thereof. In other words, the LDMOS device can switch the larger currents normally associated with a power train of a power converter by appropriately designing selected regions thereof as set forth above.

As introduced herein, the channel extension serves as a type of field plate beneath the drift region (generally includes, without limitation, the channel region or the region between the source and drain under the gate) within the semiconductor device. The function of the channel extension is to reduce the lateral gradient in the electric field formed within the drift region when the drain is biased to a high voltage level, resulting in a more constant drift field and, hence, a smaller peak field. The smaller the peak field in the drift region, the higher the breakdown voltage of the semiconductor device. A more constant drift region field is achieved by introducing a vertical component (perpendicular to the silicon-surface) to the electric field in the drift region to offset the curvature in the lateral direction-parallel to the surface. A vertical electric field component in the drift region is created by suppressing the depletion of well doping beneath the light doped region, pinning the depletion at the location of the channel extension as the drain bias is increased.

Most techniques to balance the drift field with a vertical field cause depletion of the charge in the drift region even at low drain bias, and this reduces the drive current of the device in its on-state and increases the on-state series resistance. As introduced herein, the channel extension is placed at a distance slightly below the lightly or heavily doped region of the drain to ensure that there is little depletion therein at low drain bias, but increased depletion at higher drain bias, when it is needed. Furthermore, it is preferable that the channel extension does not extend fully beneath the lightly doped region of the drain. This admits a relatively lower overall well doping beneath the drain, which will increase the depletion region directly beneath the drain, reduce the drain-to-well electric field at high drain bias, and increase the drain-to-well breakdown voltage. It will also reduce the drain capacitance compared to the case in which the channel extension is placed fully beneath the drain. Masking the channel extension from the region beneath the drain does not reduce its ability to increase the breakdown voltage. To balance the drift region field in a preferable manner, the vertical component of the depletion field beneath the lightly doped region should be larger close to the channel region, and smaller near the drain.

Finally, the channel extension typically extends beneath the channel region towards the source. This allows the channel extension to function as a field plate to increase breakdown voltage, as well as a threshold voltage control implant and a punch-through suppression implant to enable high voltage operation at short channel region lengths. A short channel region length is better suited to high switching speeds of innovative power supplies. It should be noted that, besides a short channel region length, the gate oxide should also be thin, and consistent, with the short channel region length. This combination enables better transistor performance in terms of switching speed and response time. Implemented in this way, the channel extension is a negligible mask adder to an integrated CMOS process that enables integrated high-voltage transistors. Such a CMOS process, which combines short channel region lengths and thin gate oxides for devices such as power devices, allows such devices to support high switching speeds with low on-state resistance and high breakdown voltages.

Thus, a transistor (e.g., a LDMOS device) and related method of constructing the same with readily attainable and quantifiable advantages has been introduced. Those skilled in the art should understand that the previously described embodiments of the LDMOS device, semiconductor device and related methods of constructing the same are submitted for illustrative purposes only. In addition, other embodiments capable of producing a higher voltage device such as a LDMOS device that can accommodate higher voltages and is capable of being integrated with low voltage devices on a semiconductor substrate in an integrated circuit that may form a power converter or portions thereof are well within the broad scope of the present invention.

In an advantageous embodiment, the LDMOS device and semiconductor device may be incorporated into an integrated circuit that forms a power converter or the like. Alternatively, the semiconductor device may be incorporated into an integrated circuit that forms another system such as a power amplifier, motor controller, and a system to control an actuator in accordance with a stepper motor or other electromechanical device.

Figure 19:
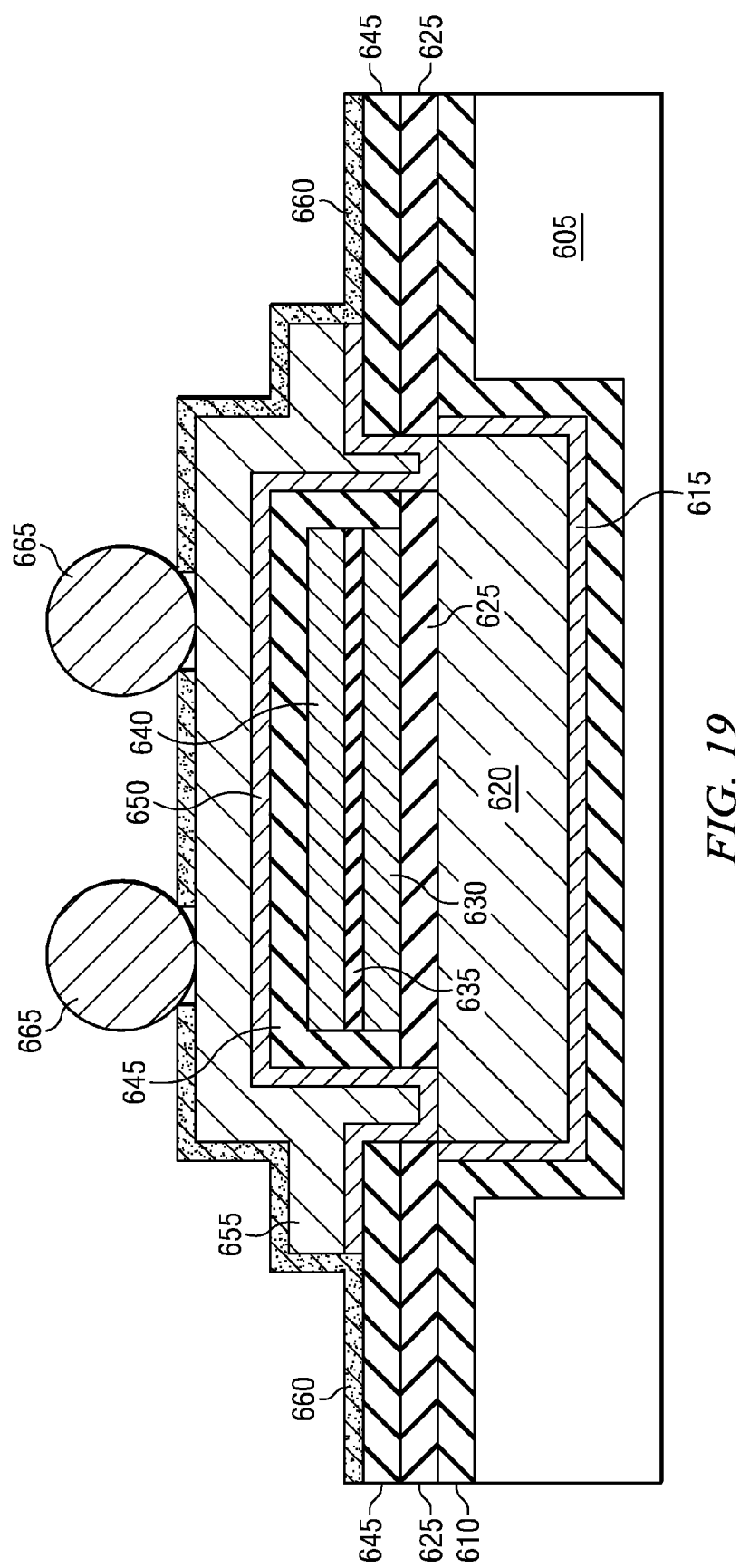
FIG. 19 illustrates a cross-sectional view of an embodiment of a micromagnetic device employable in an integrated circuit constructed according to the principles of the present invention.

Turning now to FIG. 19, illustrated is a cross-sectional view of an embodiment of a micromagnetic device employable in an integrated circuit constructed according to the principles of the present invention. The micromagnetic device is formed on a substrate 605 (e.g., silicon) and includes a first insulating layer 610 (e.g., silicon dioxide) formed thereover. Following an electroplating process to form a trench in a center region of the substrate 605, an adhesive layer (e.g., titanium or chromium) and a first seed layer 615 (e.g., gold or copper) are formed over the first insulating layer 610. Additionally, a first conductive winding layer 620 of, without limitation, copper, is formed in the trench that forms a first section of a winding for the micromagnetic device.

An adhesive layer (e.g., titanium or chromium) and a second insulating layer 625 (e.g., silicon dioxide) is formed above the first conductive winding layer 620. The micromagnetic device also includes first and second magnetic core layers 630, 640 with a third insulating layer 635 therebetween in a center region of the substrate 605 above the first conductive winding layer 620. The first and second magnetic core layers 630, 640 are typically surrounded by an adhesive layer, seed layer and protection layer as set forth below with respect to FIG. 20. Also, an adhesive layer may be formed prior to forming the third insulating layer 635.

An adhesive layer (e.g., titanium or chromium) and a fourth insulating layer 645 (e.g., silicon dioxide) are formed above the second magnetic core layer 640 in the center region of the substrate 605 and over the second insulating layer 625 laterally beyond the center region of the substrate 605. An adhesive layer (e.g., titanium or chromium) and a second seed layer 650 (e.g., gold or copper) are formed above the fourth insulating layer 645 in the center region of the substrate 605 and in vias down to the first conductive winding layer 620 about the center region of the substrate 605. A second conductive winding layer 655 is formed above the second seed layer 650 and in the vias to the first conductive winding layer 620. The second conductive winding layer 655 is formed of, without limitation, copper and forms a second section of a winding for the micromagnetic device. Thus, the first conductive winding layer 620 and the second conductive winding layer 655 form the winding for the micromagnetic device.

An adhesive layer 660 (e.g., titanium) is formed above the second conductive winding layer 655 in the center region of the substrate 605 and over the fourth insulating layer 645 laterally beyond the center region of the substrate 605. Solder balls 665 are formed in apertures in the adhesive layer 660.

Figure 20:
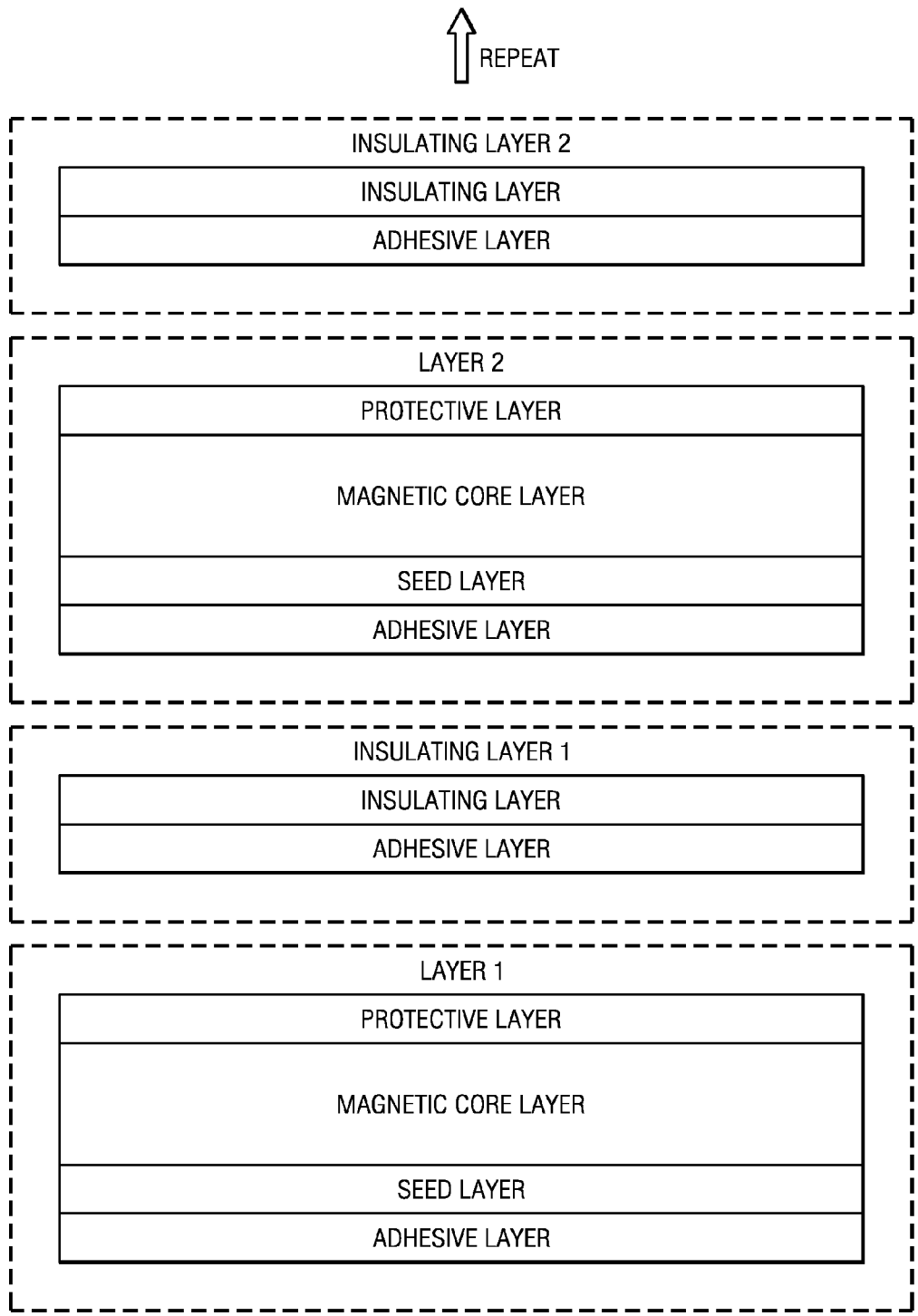
FIG. 20 illustrates a partial cross-sectional view of an embodiment of magnetic core layers of a magnetic core of a micromagnetic device employable in an integrated circuit constructed according to the principles of the present invention.

Turning now to FIG. 20, illustrated is a partial cross-sectional view of an embodiment of magnetic core layers of a magnetic core of a micromagnetic device employable in an integrated circuit constructed according to the principles of the present invention. While the present embodiment illustrates two magnetic core layers, the micromagnetic device may employ any number of magnetic core layers. The first and second magnetic core layers (designated "Layer 1" and "Layer 2") include an adhesion layer (designated "Adhesive Layer") of, without limitation, titanium or chromium and a seed layer (designed "Seed Layer") of, without limitation, gold or copper. The first and second magnetic core layers also include a magnetic core layer (designated "Magnetic Core Layer") of, without limitation, an iron-cobalt-phosphorus alloy and a protective layer (designated "Protective Layer") of, without limitation, nickel. First and second insulating layers (designated "Insulating Layer 1" and "Insulating Layer 2") include an adhesion layer (designated "Adhesive Layer") of, without limitation, titanium or chromium and an insulting layer (designated "Insulating Layer") of, without limitation, silicon dioxide or aluminum oxide. The sequence of magnetic core layers and insulation layers can be repeated as needed to form the desired number of magnetic core layers.

Numerous variations of the micromagnetic device are possible including additional or alternative layers, and should be apparent to those skilled in the art. Additionally, for a more detailed analysis of the micromagnetic device as described above, see U.S. Pat. No. 7,544,995 entitled "Power Converter Employing a Micromagnetic Device," to Lotfi, et al, issued Jun. 9, 2009, which is incorporated herein by reference. For another example of a micromagnetic device, see U.S. Pat. No. 6,495,019 entitled "Device Comprising Micromagnetic Components for Power Applications and Process for Forming Device," to Filas, et al., issued Dec. 17, 2002 and "Issues and Advances in High-Frequency Magnetics for Switching Power Supplies," by Lotfi, et al., Proceedings of the IEEE, Vol. 89, No. 6, pp. 833-845, June 2001, both of which are incorporated herein by reference.

Figure 21:
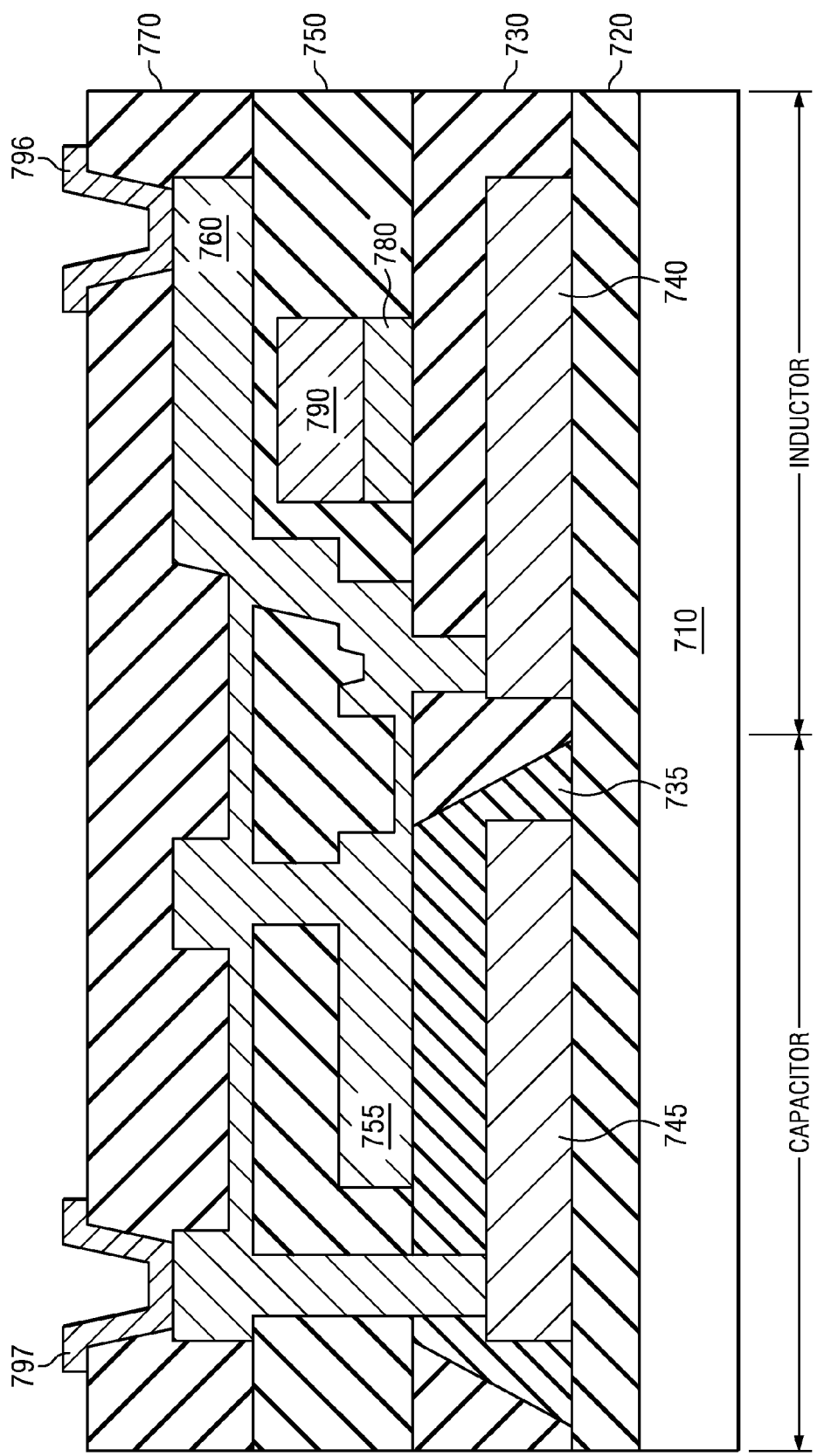
FIG. 21 illustrates a cross-sectional view of an embodiment of an output filter employable in an integrated circuit constructed according to the principles of the present invention.

Turning now to FIG. 21, illustrate is a cross-sectional view of an embodiment of an output filter employable in an integrated circuit constructed according to the principles of the present invention. In the illustrated embodiment, the output filter includes a capacitor coupled to an inductor embodied in a micromagnetic device. The output filter is constructed on a semiconductor substrate (also referred to as a "substrate," and composed of, for instance, silicon, glass, ceramic or the like) 710 having a passivation layer (e.g., silicon dioxide) 720 formed thereon using conventional formation processes such as a thermal growing process.

The micromagnetic device includes a first and second conductive winding layer (composed of, for instance, aluminum or any other conductive material) 740, 760 surrounded by first, second and third insulating layers or insulators 730, 750, 770. The micromagnetic device also includes a metallic layer 780 that provides an adequate bond between a ferromagnetic core 790 and the insulators 730, 750, 770 coupled to the substrate 710 to facilitate the fabrication of the thereof. The micromagnetic device still further includes a plurality of inner-layer vias that provide multiple paths between layers of the micromagnetic device and a terminal 796 for connection to another device.

The capacitor includes first and second capacitor plates 745, 755 and a dielectric layer 735 located between the first and second capacitor plates 745, 755. The capacitor and micromagnetic device are electrically coupled as illustrated by the conductive layers running therebetween. The capacitor also includes a plurality of inner-layer vias that provide multiple paths between the first and second plates 745, 755 of the capacitor and a terminal 797 for connection to another device. An embodiment of a micromagnetic device is disclosed in U.S. Pat. No. 6,118,351 entitled "Micromagnetic Device for Power Processing Applications and Method of Manufacture Therefor," to Kossives, et al., issued Sep. 12, 2000, and several embodiments of filter circuits are disclosed in U.S. Pat. No. 6,255,714 entitled "Integrated Circuit Having a Micromagnetic Device Including a Ferromagnetic Core and Method of Manufacture Therefor," to Kossives, et al., issued Jul. 3, 2001, both of which are incorporated by reference.

Thus, a power converter embodied, or portions thereof, in an integrated circuit and related methods of constructing the same with readily attainable and quantifiable advantages has been introduced. Those skilled in the art should understand that the previously described embodiments of the integrated circuit including the power converter and portions thereof embodied in the integrated circuit and related methods of constructing the same are submitted for illustrative purposes only. In addition, other embodiments capable of producing an integrated circuit employable with higher voltage devices and low voltage devices integrable within a semiconductor device are well within the broad scope of the present invention. While the integrated circuit has been described in the environment of a power converter, the integrated circuit may also apply to other systems such as a power amplifier, motor controller, and a system to control an actuator in accordance with a stepper motor or other electromechanical device.

In one embodiment, the integrated circuit includes a transistor advantageously embodied in a LDMOS device having a gate located over a channel region recessed into a semiconductor substrate. The transistor includes a source/drain including a lightly doped region adjacent the channel region and a heavily doped region adjacent but not surrounded by the lightly doped region. An isolation region of the transistor is adjacent the heavily doped region opposite the lightly doped region. The transistor also includes an oppositely doped well extending under the channel region and a portion of the lightly doped region of the source/drain. The transistor also includes a channel extension, within the oppositely doped well, under the channel region and extending under a portion of the lightly doped region of the source/drain by a channel extension length. The channel extension is typically of like type to and has a doping concentration profile greater than a doping concentration profile of the oppositely doped well. The transistor also includes a doped region adjacent the oppositely doped well and extending under a portion of the lightly doped region of the source/drain, and an oppositely doped buried layer under the doped region. The transistor also includes another source/drain having a lightly or heavily doped region adjacent an opposing side of the channel region, wherein the channel extension extends under a portion of the lightly or heavily doped region of the another source/drain by a channel extension length. The transistor also includes a gate dielectric layer underlying the gate, gate sidewall spacers formed about the gate, and metal contacts formed over a salicide layer formed on the gate and the source/drain.

For a related integrated circuit, see U.S. Pat. No. 7,214,985 entitled "Integrated Circuit Incorporating Higher Voltage Devices and Low Voltage Devices Therein," to Lotfi, et al., issued May 8, 2007, which is incorporated herein by reference. For a better understanding of integrated circuits, semiconductor devices and methods of manufacture therefor see "Semiconductor Device Fundamentals," by R. F. Pierret, Addison-Wesley (1996); "Handbook of Sputter Deposition Technology," by K. Wasa and S. Hayakawa, Noyes Publications (1992); "Thin Film Technology," by R. W. Berry, P. M. Hall and M. T. Harris, Van Nostrand (1968); "Thin Film Processes," by J. Vossen and W. Kern, Academic (1978); and "Handbook of Thin Film Technology," by L. Maissel and R. Glang, McGraw Hill (1970). For a better understanding of power converters, see "Modern DC-to-DC Switchmode Power Converter Circuits," by Rudolph P. Severns and Gordon Bloom, Van Nostrand Reinhold Company, New York, N.Y. (1985) and "Principles of Power Electronics," by J. G. Kassakian, M. F. Schlecht and G. C. Verghese, Addison-Wesley (1991). The aforementioned references are incorporated herein by reference in their entirety.

Also, although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A transistor having a gate located over a channel region recessed into a semiconductor substrate, comprising:
   a source/drain including a lightly doped region adjacent said channel region;
   an oppositely doped well extending under said channel region and a portion of said lightly doped region of said source/drain;
   a doped region adjacent said oppositely doped well and extending under a portion of said lightly doped region of said source/drain;
   an oppositely doped buried layer under said doped region; and
   a channel extension, within said oppositely doped well, under said channel region and extending under a portion of said lightly doped region of said source/drain.

2. The transistor as recited in claim 1 wherein said channel extension extends under said portion of said lightly doped region of said source/drain by a channel extension length.

3. The transistor as recited in claim 1 wherein said channel extension is of like type to and has a doping concentration profile greater than a doping concentration profile of said oppositely doped well.

4. The transistor as recited in claim 1 wherein said source/drain includes a heavily doped region adjacent said lightly doped region of said source/drain.

5. The transistor as recited in claim 1 wherein said source/drain includes a heavily doped region adjacent but not surrounded by said lightly doped region of said source/drain.

6. The transistor as recited in claim 1 wherein said source/drain includes a heavily doped region adjacent said lightly doped region, said transistor further comprising an isolation region adjacent said heavily doped region of said source/drain.

7. The transistor as recited in claim 1 further comprising another source/drain having a lightly doped region adjacent an opposing side of said channel region, said channel extension extending under a portion of said lightly doped region of said another source/drain by a channel extension length.

8. The transistor as recited in claim 1 further comprising another source/drain having a heavily doped region adjacent an opposing side of said channel region, said channel extension extending under a portion of said heavily doped region of said another source/drain by a channel extension length.

9. The transistor as recited in claim 1 wherein said channel extension extends under only a portion of said lightly doped region of said source/drain.

10. The transistor as recited in claim 1 further comprising a gate dielectric layer underlying said gate and gate sidewall spacers formed about said gate, said transistor further comprising metal contacts formed over a salicide layer formed on said gate and said source/drain.

11. The transistor as recited in claim 1 wherein said oppositely doped buried layer has a doping concentration profile in a range of $1 \cdot 10^{18}$ to $1 \cdot 10^{20}$ atoms/centimeter$^3$.

12. The transistor as recited in claim 1 wherein said oppositely doped well has a retrograde doping concentration profile with about $1 \cdot 10^{17}$ atoms/centimeter$^3$ in a middle area thereof.

13. The transistor as recited in claim 1 wherein said oppositely doped well has a retrograde doping concentration profile with higher doping concentration profile at a top surface and a bottom surface compared to a middle area thereof.

14. The transistor as recited in claim 1 wherein said channel extension has a doping concentration profile of about $1.2 \cdot 10^{18}$ atoms/centimeter$^3$.

15. The transistor as recited in claim 1 wherein said lightly doped region of said source/drain has a doping concentration profile in a range of $1 \cdot 10^{16}$ to $1 \cdot 10^{17}$ atoms/centimeter$^3$.

16. The transistor as recited in claim 1 wherein said gate has a thickness in a range from about 100 to 500 nanometers.

17. The transistor as recited in claim 1 wherein said doped region has a doping concentration profile in a range of $1 \cdot 10^{14}$ to $1 \cdot 10^{16}$ atoms/centimeter$^3$.

18. The transistor as recited in claim 1 wherein said channel extension extends under said portion of said lightly doped region of said source/drain by a channel extension length, said channel extension length being selected to provide an increased breakdown voltage and reduced on-state resistance for said transistor.

19. The transistor as recited in claim 1 wherein said channel extension extends under said portion of said lightly doped region of said source/drain by about 0.3 micrometers, a channel extension dose is about $1 \cdot 10^{13}$ cm$^{-2}$, a channel extension energy is about 160 kilovolts, and a length and dose of said lightly doped region of said source drain is about 0.6 micrometers and $5 \cdot 10^{12}$ cm$^{-2}$, respectively.

20. The transistor as recited in claim 1 wherein lightly doped region of said source/drain and said doped region are P-type, and said oppositely doped well, channel extension and oppositely doped buried layer are N-type.

* * * * *